US010916406B2

(12) United States Patent
Matsumoto

(10) Patent No.: US 10,916,406 B2
(45) Date of Patent: Feb. 9, 2021

(54) MULTIPLE CHARGED PARTICLE BEAM WRITING APPARATUS AND MULTIPLE CHARGED PARTICLE BEAM WRITING METHOD

(71) Applicant: NuFlare Technology, Inc., Yokohama (JP)

(72) Inventor: Hiroshi Matsumoto, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/511,094

(22) Filed: Jul. 15, 2019

(65) Prior Publication Data
US 2020/0043701 A1 Feb. 6, 2020

(30) Foreign Application Priority Data
Aug. 3, 2018 (JP) ................. 2018-147234

(51) Int. Cl.
*H01J 37/317* (2006.01)
*H01J 37/04* (2006.01)
*H01J 37/20* (2006.01)

(52) U.S. Cl.
CPC ........ *H01J 37/3177* (2013.01); *H01J 37/045* (2013.01); *H01J 37/20* (2013.01); *H01J 2237/0437* (2013.01)

(58) Field of Classification Search
CPC ...... H01J 37/045; H01J 37/20; H01J 37/3177; H01J 37/3174; H01J 2237/0435; H01J 2237/0635; H01J 2237/0437
See application file for complete search history.

(56) References Cited

U.S. PATENT DOCUMENTS

| 2015/0248993 | A1* | 9/2015 | Reiter | H01J 37/3026 |
| | | | | 250/492.22 |
| 2016/0155610 | A1* | 6/2016 | Kawana | H01J 37/3177 |
| | | | | 250/398 |
| 2017/0076912 | A1* | 3/2017 | Matsumoto | H01J 37/3023 |
| 2017/0103869 | A1* | 4/2017 | Matsumoto | H01J 37/3177 |

FOREIGN PATENT DOCUMENTS

| JP | 2015-165565 | 9/2015 |
| JP | 2016-103557 | 6/2016 |

* cited by examiner

*Primary Examiner* — David E Smith
(74) *Attorney, Agent, or Firm* — Oblon, McClelland, Maier & Neustadt, L.L.P.

(57) ABSTRACT

According to one aspect of the present invention, a multiple charged particle beam writing apparatus includes a subtraction processing circuit configured to subtract a corresponding shared dose from a dose of each of peripheral beams of a defect beam where control of a dose of a beam is disabled and the dose to be irradiated is excessive among the multiple charged particle beams, such that the same dose as an excess dose by the defect beam is shared by the peripheral beams of the defect beam; and a writing mechanism including a stage mounting a target object and a deflector deflecting the multiple charged particle beams and configured to write a pattern on the target object, using the multiple charged particle beams of doses in which the same dose as the excess dose of the defect beam is shared and is subtracted from the doses of the peripheral beams.

10 Claims, 18 Drawing Sheets

MULTIPLE CHARGED PARTICLE BEAM WRITING APPARATUS AND MULTIPLE CHARGED PARTICLE BEAM WRITING METHOD

CROSS-REFERENCE TO RELATED APPLICATION

This application is based upon and claims the benefit of priority from prior Japanese Patent Application No. 2018-147234 filed on Aug. 3, 2018 in Japan, the entire contents of which are incorporated herein by reference.

BACKGROUND OF THE INVENTION

Field of the Invention

Embodiments described herein relate generally to a multiple charged particle beam writing apparatus and a multiple charged particle beam writing method, for example, a method of reducing a dimension deviation of a pattern by multiple beam writing.

Related Art

Lithography technology contributing to the progress of miniaturization of semiconductor devices is a very important process of generating a unique pattern among semiconductor manufacturing processes. Recently, with the high integration of LSI, a circuit line width required for the semiconductor devices becomes finer year by year. Here, electron beam writing (or "drawing") technology inherently has excellent resolution and a mask pattern is written on mask blanks using an electron beam.

For example, there is a writing apparatus using multiple beams. As compared with the case of performing writing with one electron beam, irradiation of more beams can be performed at one time by using the multiple beams, so that the throughput can be greatly improved. In such a multiple beam writing apparatus, for example, electron beams emitted from an electron gun assembly are passed through a mask having a plurality of holes to form multiple beams, each beam blanking-controlled and not shielded is reduced by an optical system, a mask image is reduced, each beam is deflected by a deflector, and a desired position on a target object is irradiated with each beam.

In multiple beam writing, a dose of each beam is controlled by a beam irradiation time. However, beam irradiation time control becomes difficult due to a failure of a blanking control mechanism or the like, and a defect beam causing irradiation of the target object with a dose exceeding a desired dose may occur. For example, an always-ON beam is mentioned as a representative example. If the target object is irradiated with the excess dose, there is a problem that a shape error of a pattern formed on the target object may occur. For this problem, a method for performing an operation for searching for a correction dose value in which an error function between a total dose distribution of a writing region written by nominal multiple beams and a total dose distribution of a writing region written by the multiple beams including the defect beam is minimized and replacing doses of adjacent pixels with the correction dose value is disclosed (see Published Unexamined Japanese Patent Application No. 2015-165565, for example). However, it takes time to perform calculation processing of the error function of the total dose distribution. Here, since the total dose distribution (dose map) of the writing region written by the multiple beams depends on the arrangement of the pattern to be written and has an enormous data amount, it is difficult to perform calculation in advance and it is performed in parallel with the writing processing for each region. Therefore, the calculation processing of the error function of the total dose distribution is similarly performed in parallel with the writing processing. For this reason, in the above method, the calculation processing of the error function using the total dose distribution may not catch up with a speed of the writing processing, and the writing processing may stagnate. Therefore, it is desirable to reduce the shape error of the pattern due to the excess dose by a simpler method.

BRIEF SUMMARY OF THE INVENTION

According to one aspect of the present invention, a multiple charged particle beam writing apparatus includes:
a multiple charged particle beams generator configured to generate multiple charged particle beams;
a subtraction processing circuit configured to subtract a corresponding shared dose from a dose of each of peripheral beams of a defect beam where control of a dose of a beam is disabled and the dose to be irradiated is excessive among the multiple charged particle beams, such that the same dose as an excess dose by the defect beam is shared by the peripheral beams of the defect beam; and
a writing mechanism including a stage mounting a target object and a deflector deflecting the multiple charged particle beams and configured to write a pattern on the target object, using the multiple charged particle beams of doses in which the same dose as the excess dose of the defect beam is shared and is subtracted from the doses of the peripheral beams.

According to further aspect of the present invention, a multiple charged particle beam writing method includes:
forming multiple charged particle beams;
subtracting a corresponding shared dose from a dose of each of peripheral beams of a defect beam where control of a dose of a beam is disabled and the dose to be irradiated is excessive among the multiple charged particle beams, such that the same dose as an excess dose by the defect beam is shared by the peripheral beams of the defect beam; and
writing a pattern on a target object, using the multiple charged particle beams of doses in which the same dose as the excess dose of the defect beam is shared and is subtracted from the doses of the peripheral beams.

DETAILED DESCRIPTION OF THE INVENTION

In the following embodiments, an apparatus and an method capable of reducing a shape error of a pattern due to an excess dose by a simple method in multiple beam writing will be described.

In the following embodiments, a configuration using an electron beam as an example of a charged particle beam will be described. However, the charged particle beam is not limited to the electron beam and may be a beam using charged particles such as an ion beam.

First Embodiment

Figure 1:
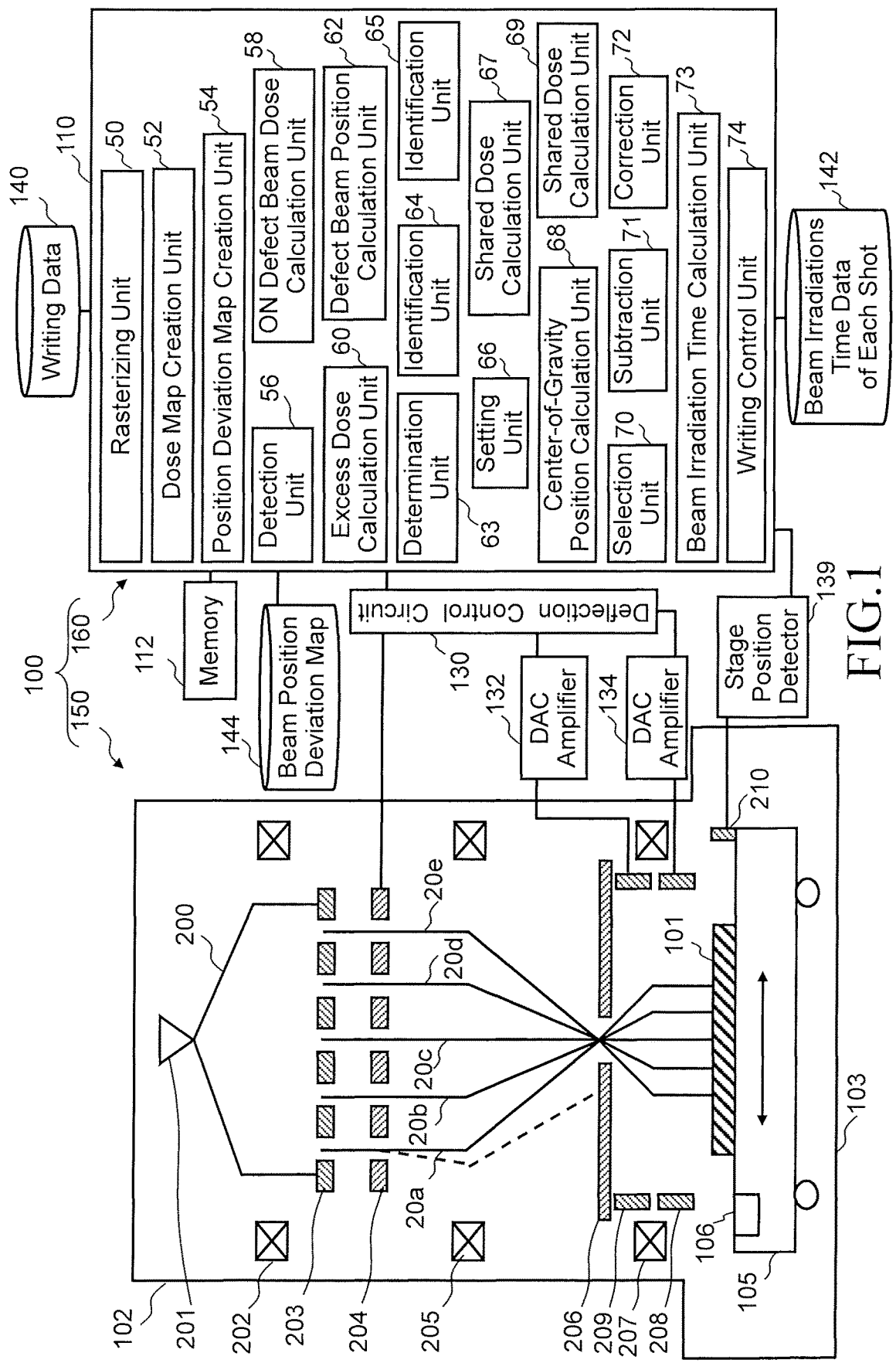
FIG. 1 is a conceptual diagram showing a configuration of a writing apparatus in a first embodiment.

FIG. 1 is a conceptual diagram showing a configuration of a writing apparatus in a first embodiment. In FIG. 1, a writing apparatus 100 includes a writing mechanism 150 and a control system circuit 160. The writing apparatus 100 is an example of a multiple charged particle beam writing apparatus. The writing mechanism 150 includes an electron lens barrel 102 (multiple electron beam column) and a writing chamber 103. An electron gun assembly 201, an illumination lens 202, a shaping aperture array substrate 203, a blanking aperture array mechanism 204, a reduction lens 205, a limiting aperture substrate 206, an objective lens 207, a deflector 208, and a deflector 209 are disposed in the electron lens barrel 102. An XY stage 105 is disposed in the writing chamber 103. A target object 101 such as a mask blank coated with a resist to be a writing target substrate at the time of writing is disposed on the XY stage 105. An exposure mask when a semiconductor device is manufactured or a semiconductor substrate (silicon wafer) where the semiconductor device is manufactured is included in the target object 101. Further, a mirror 210 for measuring a position of the XY stage 105 is disposed on the XY stage 105. Further, a Faraday cup 106 is disposed on the XY stage 105.

The control system circuit 160 has a control computer 110, a memory 112, a deflection control circuit 130, digital/analog conversion (DAC) amplifier units 132 and 134, a stage position detector 139, and storage devices 140, 142, and 144 such as magnetic disk devices. The control computer 110, the memory 112, the deflection control circuit 130, the DAC amplifier units 132 and 134, the stage position detector 139, and the storage devices 140, 142, and 144 are mutually connected via a bus not shown in the drawings. The DAC amplifier units 132 and 134 and the blanking aperture array mechanism 204 are connected to the deflection control circuit 130. An output of the DAC amplifier unit 132 is connected to the deflector 209. An output of the DAC amplifier unit 134 is connected to the deflector 208. The stage position detector 139 irradiates the mirror 210 on the XY stage 105 with laser light and receives reflected light from the mirror 210. In addition, the position of the XY stage 105 is measured by using a principle of laser interference using information of the reflected light.

A rasterization unit 50, a dose map creation unit 52, a position deviation map creation unit 54, a detection unit 56, an ON defect beam dose calculation unit 58, an excess dose calculation unit 60, a defect beam position calculation unit 62, a determination unit 63, an identification unit 64, an identification unit 65, a setting unit 66, a shared dose calculation unit 67, a center-of-gravity position calculation unit 68, a shared dose calculation unit 69, a selection unit 70, a subtraction unit 71, a correction unit 72, a beam irradiation time calculation unit 73, and a writing control unit 74 are disposed in the control computer 110. Each "unit" such as the rasterization unit 50, the dose map creation unit 52, the position deviation map creation unit 54, the detection unit 56, the ON defect beam dose calculation unit 58, the excess dose calculation unit 60, the defect beam position calculation unit 62, the determination unit 63, the identification unit 64, the identification unit 65, the setting unit 66, the shared dose calculation unit 67, the center-of-gravity position calculation unit 68, the shared dose calculation unit 69, the selection unit 70, the subtraction unit 71, the correction unit 72, the beam irradiation time calculation unit 73, and the writing control unit 74 has a processing circuit. The processing circuit includes an electric circuit, a computer, a processor, a circuit board, a quantum circuit, or a semiconductor device, for example. Each "unit" may use a common processing circuit (the same processing circuit) or may use a different processing circuit (a separate processing circuit) Information input to and output from the rasterization unit 50, the dose map creation unit 52, the position deviation map creation unit 54, the detection unit 56, the ON defect beam dose calculation unit 58, the excess dose calculation unit 60, the defect beam position calculation unit 62, the determination unit 63, the identification unit 64, the identification unit 65, the setting unit 66, the shared dose calculation unit 67, the center-of-gravity position calculation unit 68, the shared dose calculation unit 69, the selection unit 70, the subtraction unit 71, the correction unit 72, the beam irradiation time calculation unit 73, and the writing control unit 74 and information during calculations are stored in the memory 112 each time.

Further, writing data is input from the outside of the writing apparatus 100 and is stored in the storage device 140. In the writing data, generally, information of a plurality of figure patterns for writing is defined. Specifically, a figure code, coordinates, and a size are defined for each figure pattern.

Here, in FIG. 1, the configuration necessary for describing the first embodiment is described. The writing apparatus 100 may generally include other necessary configuration.

Figure 2:
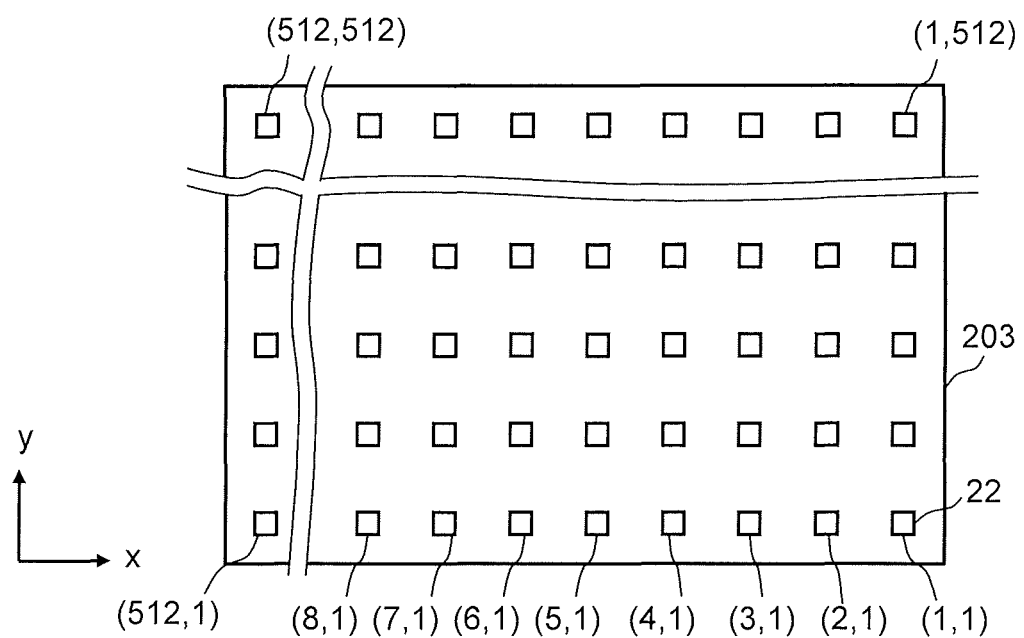
FIG. 2 is a conceptual diagram showing a configuration of a shaping aperture array substrate in the first embodiment.

FIG. 2 is a conceptual diagram showing a configuration of the shaping aperture array substrate in the first embodiment. In FIG. 2, in the shaping aperture array substrate 203, p×q (p, q≥2) holes (openings) 22 in a length direction (y direction) and a width direction (x direction) are formed in a matrix of rows and columns at a predetermined arrangement pitch. In FIG. 2, for example, 512×512 holes 22 are formed in the width and length directions (x and y directions). Each hole 22 is formed of a rectangle with the same dimension and shape.

Alternatively, each hole 22 may have a shape of a circle with the same diameter. A part of electron beams 200 passes through the plurality of holes 22, so that multiple beams 20 are formed. In other word, the shaping aperture array substrate 203 is an example of a multiple charged particle beams generator generating multiple beams 20. Further, a method of arranging the holes 22 is not limited to the case where the holes 22 are disposed in a lattice in the width and length directions, as shown in FIG. 2. For example, the holes in a k-th column and a (k+1)-th column in the length direction (y direction) may be disposed to be deviated by a dimension a in the width direction (x direction). Likewise, the holes in the (k+1)-th column and a (k+2)-th column in the length direction (y direction) may be disposed to be deviated by a dimension b in the width direction (x direction).

Figure 3:
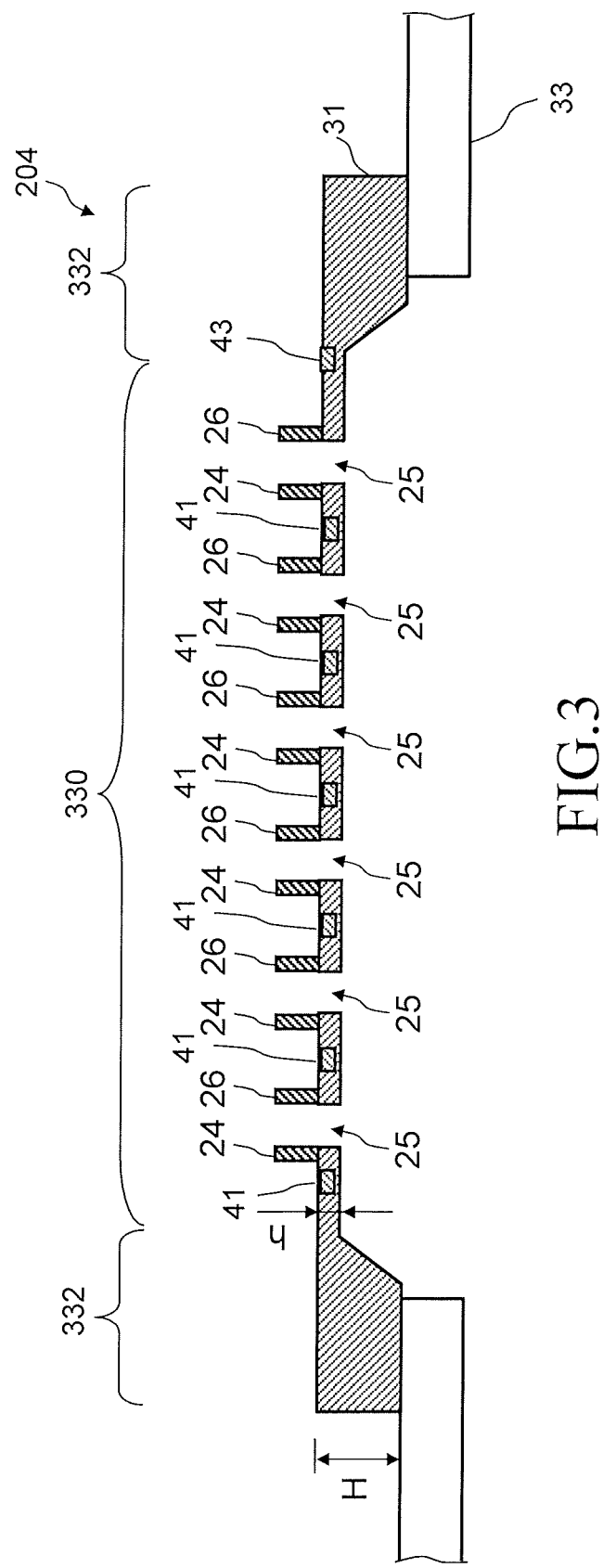
FIG. 3 is a cross-sectional view showing a configuration of a blanking aperture array mechanism in the first embodiment.

FIG. 3 is a cross-sectional view showing a configuration of the blanking aperture array mechanism in the first embodiment.

Figure 4:
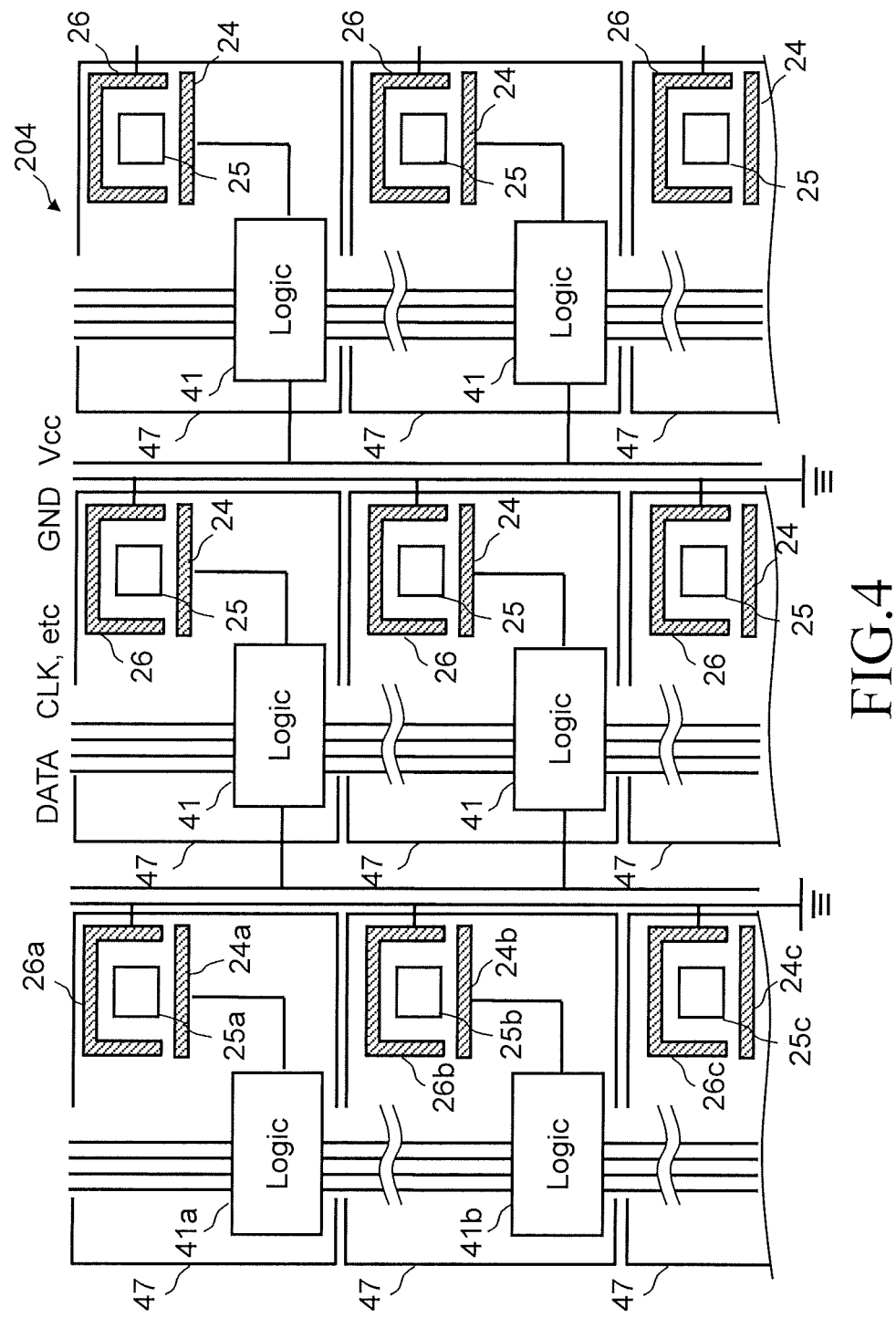
FIG. 4 is a top surface conceptual diagram showing a part of a configuration in a membrane region of the blanking aperture array mechanism in the first embodiment.

FIG. 4 is a top surface conceptual diagram showing a part of a configuration in a membrane region of the blanking aperture array mechanism in the first embodiment. In FIGS. 3 and 4, a position relation between control electrodes 24, counter electrodes 26, control circuits 41, and pads 43 is not shown in the same manner. In the blanking aperture array mechanism 204, as shown in FIG. 3, a semiconductor substrate 31 made of silicon or the like is disposed on a support base 33. A center portion of the substrate 31 is thinly scraped from the back surface side, for example, and is processed into a membrane region 330 (first region) with a small film thickness h. A surrounding region of the membrane region 330 becomes an outer circumferential region 332 (second region) with a large film thickness H. A top surface of the membrane region 330 and a top surface of the outer circumferential region 332 are formed to be at the same height position or substantially at the height position. The substrate 31 is held on the support base 33 on a back surface of the outer circumferential region 332. A center portion of the support base 33 is opened and the membrane region 330 is located in an opened region of the support base 33.

In the membrane region 330, a passage hole 25 (opening) for passing each beam of the multiple beams 20 is formed at a position corresponding to each hole 22 of the shaping aperture array substrate 203 shown in FIG. 2. In other words, in the membrane region 330 of the substrate 31, a plurality of passage holes 25 through which the corresponding beams of the multiple beams 20 using electron beams pass are formed in an array. In addition, a plurality of electrode pairs each having two electrodes at positions facing each other with the corresponding passage hole 25 among the plurality of passage holes 25 interposed therebetween are disposed on the membrane region 330 of the substrate 31. Specifically, as shown in FIGS. 3 and 4, a set (blanker: blanking deflector) of the control electrode 24 and the counter electrode 26 for blanking deflection provided at positions in the vicinity of each passage hole 25 with the corresponding passage hole 25 interposed therebetween is disposed on the membrane region 330. Further, the control circuit 41 (logic circuit) for applying a deflection voltage to the control electrode 24 for each passage hole 25 is disposed in the substrate 31 and in the vicinity of each passage hole 25 on the membrane region 330. The counter electrode 26 for each beam is connected to a ground.

Further, as shown in FIG. 4, n-bit (for example, 10-bit) parallel wiring lines for control signals are connected to each control circuit 41. In addition to the n-bit parallel wiring lines for the control signals, a clock signal line, a read signal, a shot signal, and a power supply wiring line are connected to each control circuit 41. For the clock signal line, the read signal, the shot signal, and the power supply wiring line, a part of the parallel wiring lines may be used. An individual blanking mechanism 47 is configured by the control electrode 24, the counter electrode 26, and the control circuit 41, for each of the beams configuring the multiple beams. Further, in an example of FIG. 3, the control electrode 24, the counter electrode 26, and the control circuit 41 are disposed in the membrane region 330 with the small film thickness in the substrate 31. However, the present disclosure is not limited thereto. Further, the plurality of control circuits 41 formed in an array in the membrane region 330 are grouped by the same row or the same column, for example, and the control circuits 41 in the group are connected in series as shown in FIG. 4. In addition, a signal from the pad 43 disposed for each group is transmitted to the control circuits 41 in the group. Specifically, a shift register not shown in the drawings is disposed in each control circuit 41. For example, shift registers in the control circuits 41 of the beams in the same row among the p×q multiple beams are connected in series. In addition, for example, control signals of the beams in the same row among the p×q multiple beams are transmitted in series, and the control signals of the respective beams are stored in the corresponding control circuits 41 by p clock signals.

Figure 5:
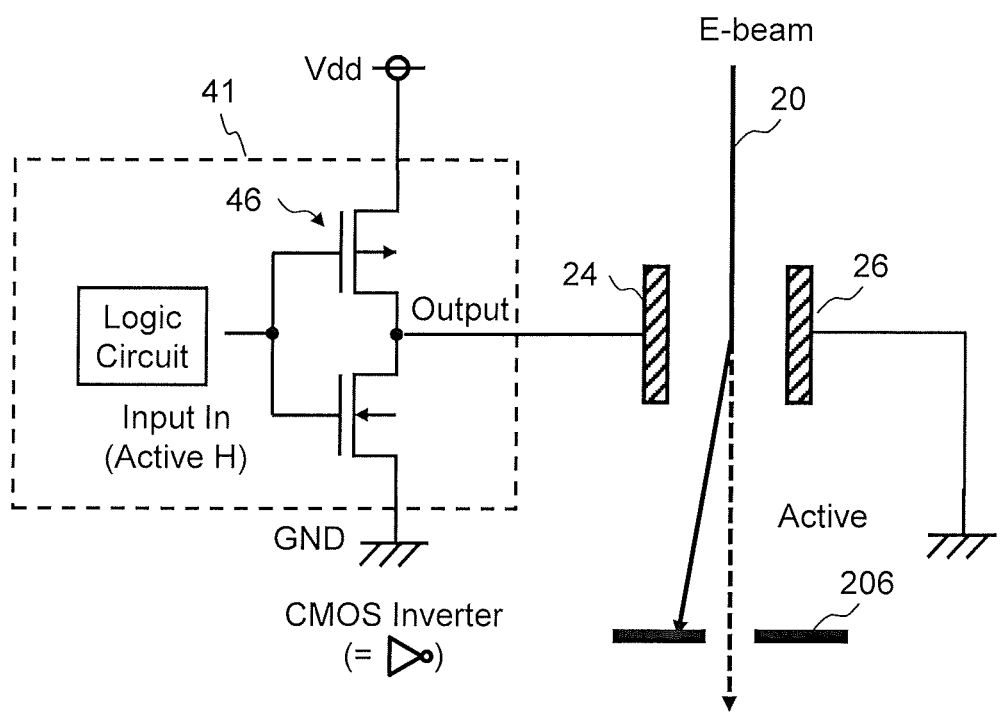
FIG. 5 is a diagram showing an example of an individual blanking mechanism in the first embodiment.

FIG. 5 is a diagram showing an example of the individual blanking mechanism in the first embodiment. In FIG. 5, an amplifier 46 (an example of a switching circuit) is disposed in the control circuit 41. In the example of FIG. 5, a complementary MOS (CMOS) inverter circuit is disposed as an example of the amplifier 46. In addition, the CMOS inverter circuit is connected to a positive potential (Vdd: blanking potential: first potential) (for example, 5 V) (first potential) and a ground potential (GND: second potential). An output line (OUT) of the CMOS inverter circuit is connected to the control electrode 24. On the other hand, the ground potential is applied to the counter electrode 26. In addition, the plurality of control electrodes 24 to which the blanking potential and the ground potential are switchably applied are disposed on the substrate 31 at positions facing each of the plurality of counter electrodes 26 with the corresponding passage holes 25 of the plurality of passage holes 25 interposed therebetween.

Any one of an low (L) potential (for example, the ground potential) lower than a threshold voltage and a high (H) potential (for example, 1.5 V) equal to or higher than the threshold voltage is applied as a control signal to an input (IN) of the CMOS inverter circuit. In the first embodiment, in a state where the L potential is applied to the input (IN) of the CMOS inverter circuit, control is performed such that the output (OUT) of the CMOS inverter circuit becomes a positive potential (Vdd), and the corresponding beam 20 is deflected by an electric field due to a potential difference with the ground potential of the counter electrode 26, is shielded by the limiting aperture substrate 206, and becomes beam OFF. On the other hand, in a state (active state) where the H potential is applied to the input (IN) of the CMOS inverter circuit, control is performed such that the output (OUT) of the CMOS inverter circuit becomes a ground potential, the potential difference with the ground potential of the counter electrode 26 disappears, and the corresponding beam 20 is not deflected, passes through the limiting aperture substrate 206, and becomes beam ON.

The electron beam 20 passing through each passage hole is deflected by the voltage applied to the control electrode 24 and the counter electrode 26 making a pair independently. Blanking control is performed by the deflection. Specifically, the set of the control electrode 24 and the counter electrode 26 individually performs blanking deflection on each corresponding beam of the multiple beams 20 by the potential switched by the CMOS inverter circuit to be the corresponding switching circuit. As such, a plurality of blankers perform the blanking deflection of each corresponding beam among the multiple beams 20 having passed through the plurality of holes 22 (openings) of the shaping aperture array substrate 203.

Figure 6:
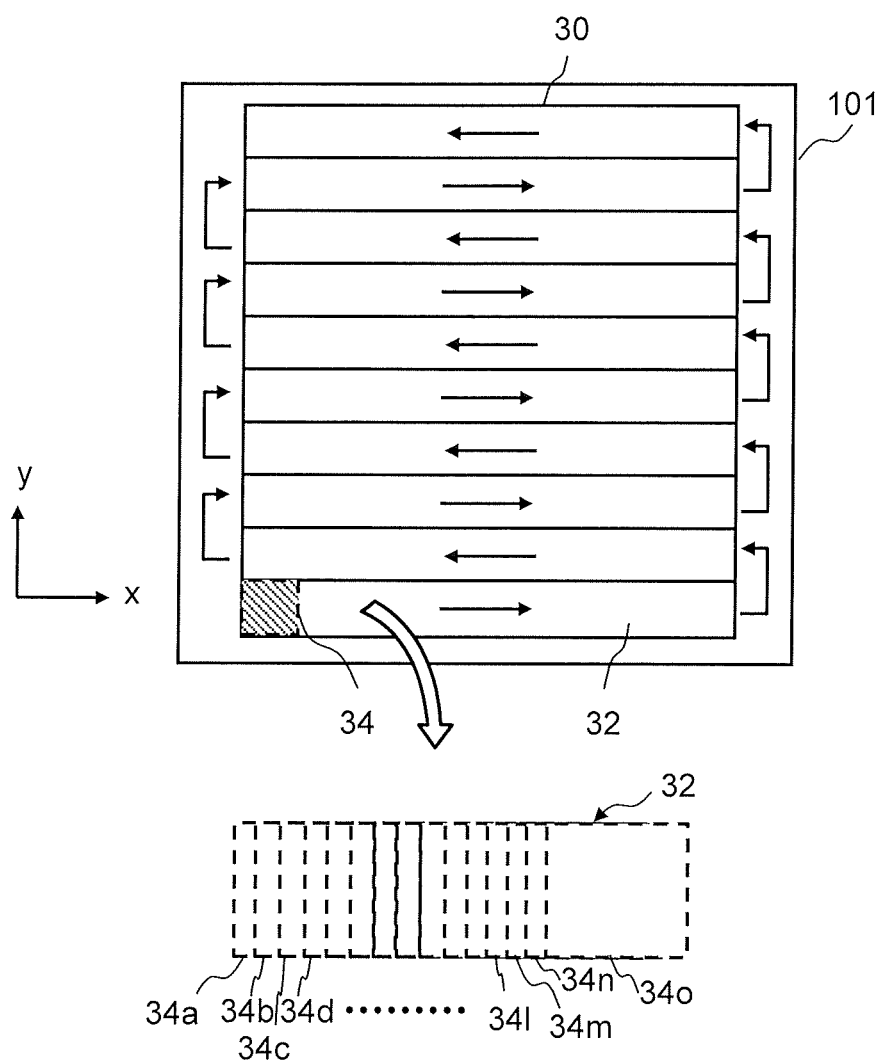
FIG. 6 is a conceptual diagram illustrating an example of a writing operation in the first embodiment.

FIG. 6 is a conceptual diagram illustrating an example of a writing operation in the first embodiment. As shown in FIG. 6, a writing region 30 of the target object 101 is virtually divided into a plurality of strip-like stripe regions 32 with a predetermined width in the y direction, for example. First, the XY stage 105 is moved, adjustment is performed such that an irradiation region 34 capable of being irradiated with one shot of the multiple beams 20 is located at a left end of the first stripe region 32 or a left position thereof, and writing starts. At the time of writing of the first stripe region 32, the writing is advanced relatively in the x direction by moving the XY stage 105 in the −x direction, for example. The XY stage 105 is continuously moved at a constant speed, for example. After the writing of the first stripe region 32 is completed, the stage position is moved in the −y direction, adjustment is performed such that the irradiation region 34 is located relatively in the y direction at a right end of the second stripe region 32 or a right position thereof, and the writing is similarly performed in the −x direction by moving the XY stage 105 in the x direction, for example. A writing time can be shortened by performing the writing while changing a direction alternately, such that the writing is performed in the x direction in the third stripe region 32 and the writing is performed in the −x direction in the fourth stripe region 32. However, the present disclosure is not limited to the case of performing the writing while changing the direction alternately. At the time of writing of each stripe region 32, the writing may be advanced in the same direction. In one shot, by the multiple beams formed by passing through each hole 22 of the shaping aperture array substrate 203, a plurality of shot patterns having the same number as the plurality of holes 22 formed in the shaping aperture array substrate 203 at the maximum are formed at one time. In the example of FIG. 6, the case of writing each stripe region 32 once is shown. However, the present disclosure is not limited thereto. Multi-writing in which the same region is written a plurality of times is preferably performed. When the multi-writing is performed, it is preferable to set the stripe region 32 of each pass while shifting the position.

Figure 7:
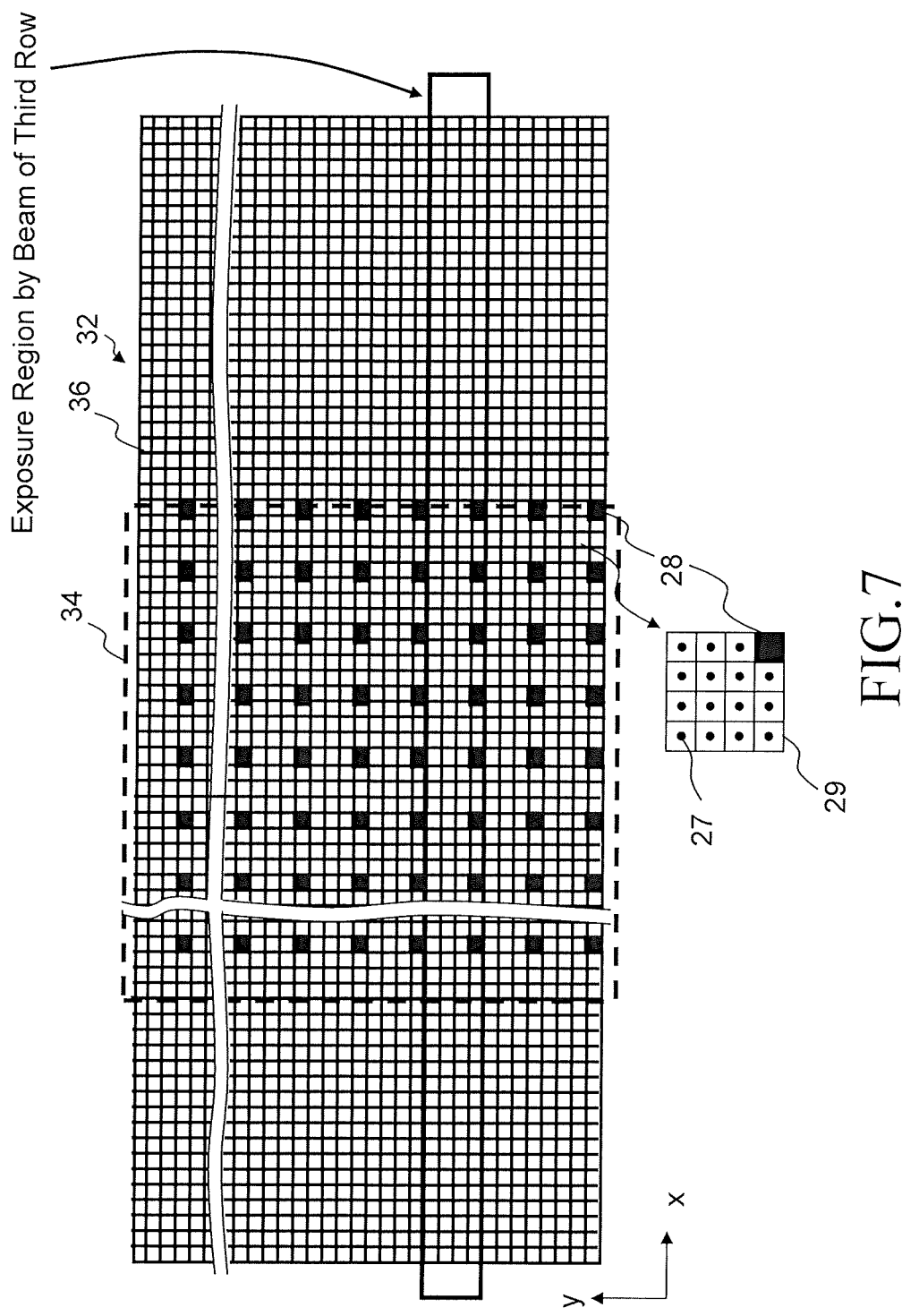
FIG. 7 is a diagram showing an example of a multiple beam irradiation region and a writing target pixel in the first embodiment.

FIG. 7 is a diagram showing an example of a multiple beam irradiation region and a writing target pixel in the first embodiment. In FIG. 7, in the stripe region 32, for example, a plurality of control grids 27 (design grids) arranged in a lattice at a beam size pitch of the multiple beams 20 on a surface of the target object 101 are set. For example, an arrangement pitch of about 10 nm is preferable. The plurality of control grids 27 become design irradiation positions of the multiple beams 20. The arrangement pitch of the control grids 27 is not limited to the beam size and may be configured by any size that can be controlled as the deflection position of the deflector 209 regardless of the beam size. In addition, a plurality of pixels 36 virtually divided in a mesh shape with the same size as the arrangement pitch of the control grids 27 around each control grid 27 are set. Each pixel 36 is an irradiation unit region per one beam of the multiple beams. In the example of FIG. 7, the case where the writing region of the target object 101 is divided into the plurality of stripe regions 32 with substantially the same width size as the size of the irradiation region 34 (writing field) which can be irradiated with one irradiation of the multiple beams 20 in the y direction is shown. The x-direction size of the irradiation region 34 can be defined as a value obtained by multiplying the inter-beam pitch of the x direction of the multiple beams 20 by the number of beams in the x direction. The y-direction size of the irradiation region 34 can be defined as a value obtained by multiplying the inter-beam pitch of the y direction of the multiple beams 20 by the number of beams in the y direction. The width of the stripe region 32 is not limited thereto. A size that is n times (n is an integer of 1 or more) the size of the irradiation region 34 is preferable. In the example of FIG. 7, for example, 512×512 multiple beams is shown to be abbreviated to 8×8 multiple beams. Further, in the irradiation region 34, a plurality of pixels 28 (beam writing positions) which can be irradiated with one shot of the multiple beams 20 are shown. In other words, the pitch between the adjacent pixels 28 is the design inter-beam pitch of the multiple beams. In the example of FIG. 7, a sub-irradiation region 29 is configured by a square region surrounded by the four adjacent pixels 28 and including one of the four pixels 28. In the example of FIG. 7, the case where each sub-irradiation region 29 is configured by 4×4 pixels is shown.

Figure 8:
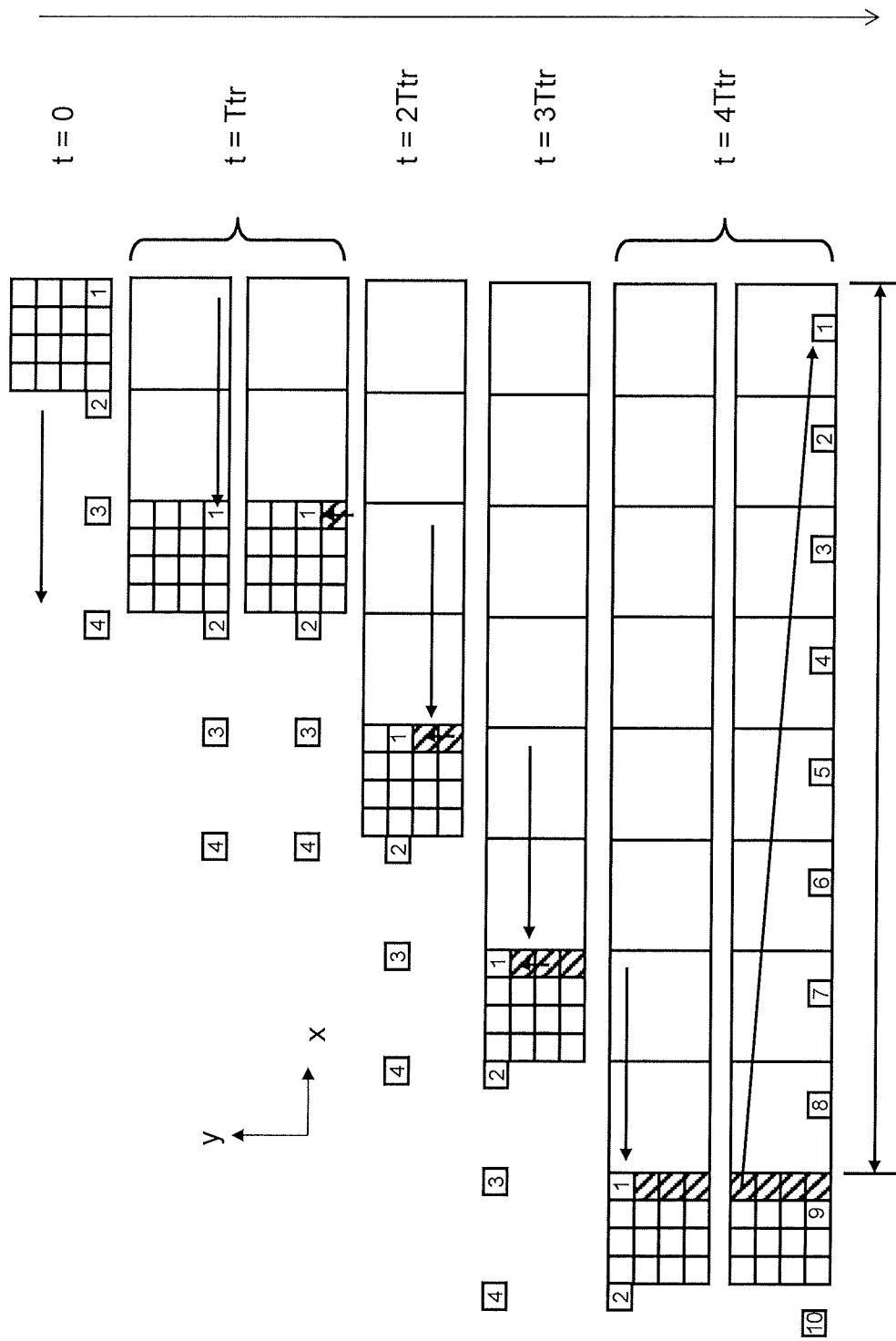
FIG. 8 is a diagram illustrating an example of a multiple beam writing method in the first embodiment.

FIG. 8 is a diagram illustrating an example of a multiple beam writing method in the first embodiment. In FIG. 8, a part of the sub-irradiation regions 29 written by the respective beams of the coordinates (1, 3), (2, 3), (3, 3), . . . , and (512, 3) of a third step in the y direction among the multiple beams for writing the stripe region 32 shown in FIG. 7 is shown. In the example of FIG. 8, the case where four pixels are written (exposed) while the XY stage 105 moves by a distance corresponding to an eight-beam pitch is shown. During writing (exposing) of the four pixels, the irradiation region 34 is caused to follow the movement of the XY stage 105 by deflecting the entire multiple beams 20 collectively by the deflector 208, such that a relative position with the target object 101 is not deviated due to the movement of the XY stage 105. In other words, tracking control is performed. In the example of FIG. 8, the case where one tracking cycle is implemented by writing (exposing) the four pixels while the XY stage 105 moves by distance corresponding to the eight-beam pitch is shown.

Specifically, the stage position detector 139 irradiates the mirror 210 with the laser, receives reflected light from the mirror 210, and measures a position of the XY stage 105. The measured position of the XY stage 105 is output to the control computer 110. In the control computer 110, the writing control unit 74 outputs position information of the XY stage 105 to the deflection control circuit 130. The deflection control circuit 130 calculates deflection amount data (tracking deflection data) for beam deflection so as to follow the movement of the XY stage 105, according to the movement of the XY stage 105. The tracking deflection data to be a digital signal is output to the DAC amplifier 134. The DAC amplifier 134 converts the digital signal into an analog signal, amplifies the signal, and applies the signal as a tracking deflection voltage to the deflector 208.

In addition, the writing mechanism 150 irradiates each control grid 27 with a beam corresponding to each ON beam among the multiple beams 20, for a writing time (beam irradiation time or exposure time) corresponding to each control grid 27 within a maximum writing time Ttr among beam irradiation times of the respective beams of the multiple beams in the shot.

In the example of FIG. 8, by a beam (1) of the coordinates (1, 3), irradiation of the beam of the first shot is performed on the control grid 27 of the first pixel 36 from the right side of the lowermost step, for example, in the attention sub-irradiation region 29, during a period of time from t=0 to t=maximum writing time Ttr. As a result, the pixel is irradiated with the beam for a desired beam irradiation time. The XY stage 105 is moved in the −x direction by the two-beam pitch, for example, during the period of time from t=0 to t=Ttr. Meanwhile, the tracking operation is continuously performed.

After the maximum writing time Ttr of the shot elapses from the start of beam irradiation of the shot, by collectively deflecting the multiple beams 20 by the deflector 209 separately from the beam deflection for the tracking control while continuously performing the beam deflection for the tracking control by the deflector 208, the writing position (previous writing position) of each beam is shifted to a next beam writing position (present writing position). In the example of FIG. 8, at a point of time of t=Ttr, the writing target control grid 27 is shifted from the control grid 27 of the first pixel 36 from the right side of the lowermost step of the attention sub-irradiation region 29 to the control grid 27 of the first pixel 36 from the right side of the second step from the bottom. Meanwhile, since the XY stage 105 moves at a constant speed, the tracking operation is continuously performed.

In addition, the irradiation of the corresponding beam of each ON beam among the multiple beams 20 is performed at the shifted writing position of each beam for each corresponding writing time in the maximum writing time Ttr of the shot, while the tracking control is continuously performed. In the example of FIG. 8, by the beam (1) of the coordinates (1, 3), irradiation of the beam of the second shot is performed on the control grid 27 of the first pixel 36 from the right side of the second step from the bottom, for example, in the attention sub-irradiation region 29, during a period of time from t=Ttr to t=2Ttr. The XY stage 105 is moved in the −x direction by the two-beam pitch, for example, during the period of time from t=Ttr to t=2Ttr. Meanwhile, the tracking operation is continuously performed.

In the example of FIG. 8, at a point of time of t=2Ttr, the writing target control grid 27 is shifted from the control grid 27 of the first pixel 36 from the right side of the second step from the bottom in the attention sub-irradiation region 29 to the control grid 27 of the first pixel 36 from the right side of the third step from the bottom, by collective deflection of the multiple beams by the deflector 209. Meanwhile, since the XY stage 105 moves, the tracking operation is continuously performed. In addition, by the beam (1) of the coordinates (1, 3), irradiation of the beam of the third shot is performed on the control grid 27 of the first pixel 36 from the right side of the third step from the bottom, for example, in the attention sub-irradiation region 29, during a period of time from t=2Ttr to t=3Ttr. As a result, the control grid 27 of the pixel 36 is irradiated with the beam for a desired beam irradiation time.

The XY stage 105 is moved in the −x direction by the two-beam pitch, for example, during the period of time from t=2Ttr to t=3Ttr. Meanwhile, the tracking operation is continuously performed. At a point of time of t=3Ttr, the writing target pixel is shifted from the control grid 27 of the first pixel 36 from the right side of the third step from the bottom in the attention sub-irradiation region 29 to the control grid 27 of the first pixel 36 from the right side of the fourth step from the bottom, by collective deflection of the multiple beams by the deflector 209. Meanwhile, since the XY stage 105 moves, the tracking operation is continuously performed.

In addition, by the beam (1) of the coordinates (1, 3), irradiation of the beam of the fourth shot is performed on the control grid 27 of the first pixel 36 from the right side of the fourth step from the bottom, for example, in the attention sub-irradiation region 29, during a period of time from t=3Ttr to t=4Ttr. As a result, the control grid 27 of the pixel 36 is irradiated with the beam for a desired beam irradiation time.

The XY stage 105 is moved in the −x direction by the two-beam pitch, for example, during the period of time from t=3Ttr to t=4Ttr. Meanwhile, the tracking operation is continuously performed. By the above, writing of the first pixel column from the right side of the attention sub-irradiation region 29 is completed.

In the example of FIG. 8, after irradiation of the beam corresponding to the writing position of each beam after being shifted three times from the initial position, the DAC amplifier unit 134 returns the tracking position to the tracking start position where the tracking control has started, by resetting the beam deflection for the tracking control. In other words, the tracking position is returned in a direction opposite to the stage movement direction. In the example of FIG. 8, at a point of time of t=4Ttr, tracking of the attention sub-irradiation region 29 is released, and the beam is returned to the attention sub-irradiation region 29 deviated by the 8-beam pitch in the x direction. In the example of FIG. 8, although the beam (1) of the coordinates (1, 3) is described, the writing is similarly performed on the corresponding sub-irradiation regions 29 with respect to the beams of the other coordinates. That is, the beam of the coordinates (n, m) completes writing of the first pixel column from the right side with respect to the corresponding sub-irradiation region 29 at the point of time of t=4Ttr. For example, the beam (2) of the coordinates (2, 3) completes writing of the first pixel column from the right side with respect to the sub-irradiation region 29 adjacent in the −x direction of the attention sub-irradiation region 29 for the beam (1) in FIG. 7.

Since the writing of the first pixel column from the right side of each sub-irradiation region 29 is completed, the deflector 209 first performs deflection so as to adjust (shift) the writing position of the corresponding beam to the control grid 27 of the second pixel from the right side of the first step from the bottom of each sub-irradiation region 29 in a next tracking cycle after tracking reset As described above, in a state where the irradiation region 34 is controlled by the deflector 208 to be at the same relative position with respect to the target object 101 during the same tracking cycle, each shot is performed while shifting is performed by one control grid (pixel 36) by the deflector 209. In addition, after the tracking cycle of one cycle ends, the tracking position of the irradiation region 34 is returned, the first shot position is adjusted to the position shifted by one control grid (one pixel) as shown in the lower step of FIG. 6, a next tracking control is performed, and each shot is performed while shifting is performed by one control grid (one pixel) by the deflector 209. By repeating the above operation during the writing of the stripe region 32, the position of the irradiation region 34 is sequentially moved in the order of irradiation regions 34a to 34o, and the writing of the stripe region is performed.

At the time of writing the target object 101 with the multiple beams 20, as described above, sequential and continuous irradiation of the multiple beams 20 to be shot beams are performed by one control grid (one pixel) by the movement of the beam deflection position by the deflector 209 while following the movement of the XY stage 105 during the tracking operation by the deflector 208. In addition, which control grid 27 (pixel 36) on the target object 101 is irradiated with which beam of the multiple beams is determined by a writing sequence. In addition, a region of the beam pitch (x direction)×the beam pitch (y direction) between beams adjacent to each other in the x and y directions on the surface of the target object 101 is configured by a region (sub-irradiation region 29) of n×n pixels, using the beam pitch between beams adjacent to each other in the x and y directions of the multiple beams. For example, when the XY stage 105 moves in the −x direction by the beam pitch (x direction) in one tracking operation, n control grids (n pixels) are written while the irradiation position is shifted by one beam in the y direction as described above. Alternatively, the n control grids (n pixels) may be written while the irradiation position is shifted by one beam in the x direction or in the oblique direction. The other n pixels in the same n×n pixel region are similarly written by a beam different from the beam described above in a next tracking operation. As described above, by writing the pixels by n pixels by different beams in n tracking operations, all pixels in one n×n pixel region are written. The same operation is performed at the same timing with respect to the other n×n pixel regions in the irradiation region of the multiple beams, and the same writing is performed.

Next, an operation of the writing mechanism 150 in the writing apparatus 100 will be described. The electron beams 200 emitted from the electron gun assembly 201 (emission source) illuminate the entire shaping aperture array substrate 203 substantially vertically by the illumination lens 202. The plurality of rectangular holes (openings) are formed in the shaping aperture array substrate 203, and the electron beams 200 illuminate a region including all the plurality of holes 22. Each part of the electron beams 200 with which the positions of the plurality of holes 22 are irradiated passes through the plurality of holes 22 of the shaping aperture array substrate 203, so that a plurality of rectangular electron beams (multiple beams) 20a to 20e are formed. The multiple beams 20a to 20e pass through the corresponding blankers (first deflectors: individual blanking mechanisms) of the blanking aperture array mechanism 204, respectively. Each of the blankers deflects (performs blanking deflection) an electron beam passing through each blanker.

The multiple beams 20a to 20e that have passed through the blanking aperture array mechanism 204 are reduced by the reduction lens 205 and travel toward the center hole formed in the limiting aperture substrate 206. Here, the electron beam 20a deflected by the blanker of the blanking aperture array mechanism 204 deviates from the center hole of the limiting aperture substrate 206 and is shielded by the limiting aperture substrate 206. On the other hand, the electron beams 20b to 20e not deflected by the blanker of the blanking aperture array mechanism 204 pass through the center hole of the limiting aperture substrate 206 as shown in FIG. 1. By turning on/off the individual blanking mechanism 47, blanking control is performed and ON/OFF of the beam is controlled. As described above, the limiting aperture substrate 206 shields each beam deflected to become a beam OFF state by the individual blanking mechanism 47. In addition, a beam of one shot is formed by the beam having passed through the limiting aperture substrate 206, formed from beam ON to beam OFF, for each beam. The multiple beams 20 having passed through the limiting aperture substrate 206 are focused by the objective lens 207 to form a pattern image of a desired reduction ratio, the beams (entire multiple beams 20) having passed through the limiting aperture substrate 206 are collectively deflected in the same direction by the deflectors 208 and 209, and the respective irradiation positions of the beams on the target object 101 are irradiated with the beams. The multiple beams 20 to be irradiated at one time are ideally arranged at a pitch obtained by multiplying the arrangement pitch of the plurality of holes 22 of the shaping aperture array substrate 203 by the desired reduction ratio.

Figure 9:
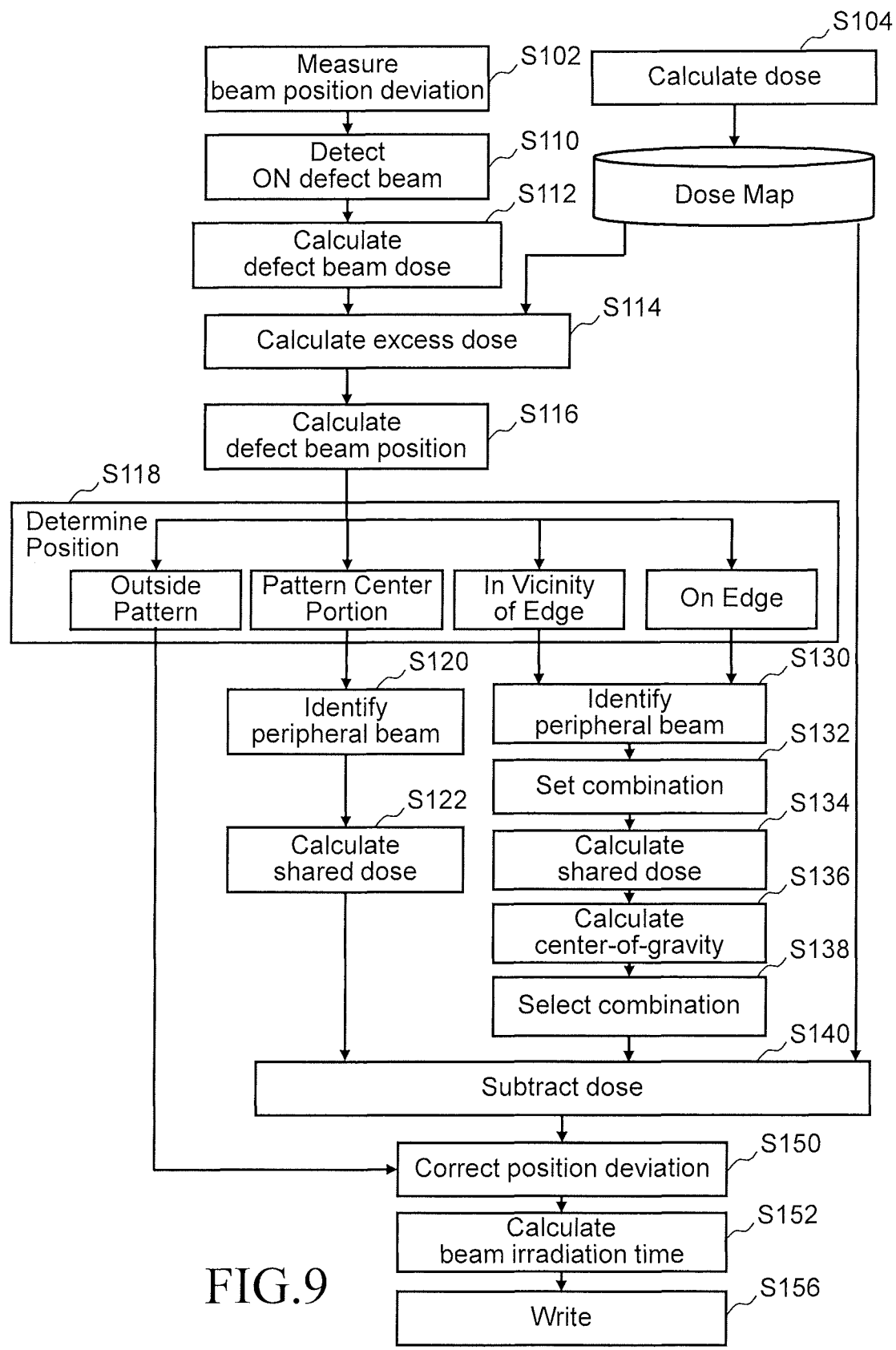
FIG. 9 is a flowchart showing main steps of the writing method in the first embodiment.

FIG. 9 is a flowchart showing main steps of the writing method in the first embodiment. In FIG. 9, the writing method in the first embodiment executes a series of steps including a beam position deviation amount measurement step (S102), a dose calculation step (S104), an ON defect beam detection step (S110), a defect beam dose calculation step (S112), an excess dose calculation step (S114), a defect beam position calculation step (S116), a position determination step (S118), a peripheral beam identification step (S120), a shared dose calculation step (S122), a peripheral beam identification step (S130), a combination setting step (S132), a shared dose calculation step (S134), a center-of-gravity calculation step (S136), a combination selection step (S138), a dose subtraction step (S140), a position deviation correction step (S150), a beam irradiation time calculation step (S152), and a writing step (S156).

In the beam position deviation amount measurement step (S102), the writing apparatus 100 measures a position deviation amount in which the irradiation position of each beam of the multiple beams 20 on the surface of the target object 101 is deviated from the corresponding control grid 27.

Figure 10B:
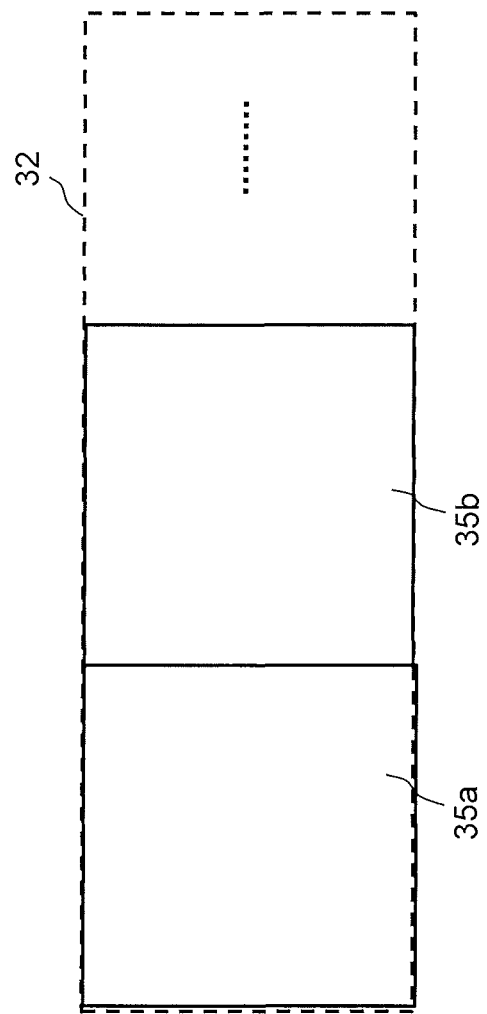
FIGS. 10A and 10B are diagrams illustrating position deviation and position deviation periodicity of a beam in the first embodiment.
Figure 10A:
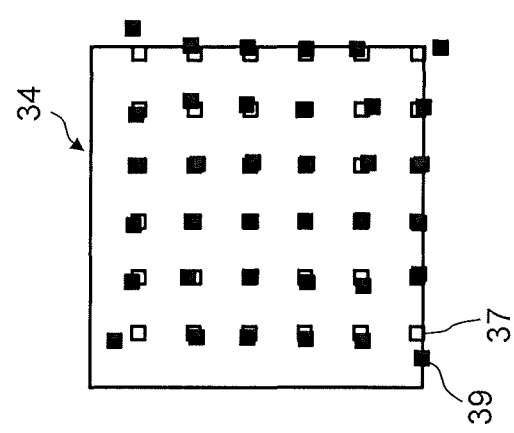

FIGS. 10A and 10B are diagrams illustrating position deviation and position deviation periodicity of a beam in the first embodiment. In the multiple beams 20, as shown in FIG. 10A, distortion occurs in an exposure field due to a characteristic of an optical system, and an actual irradiation position 39 of each beam may be deviated from the irradiation position 37 when an ideal grid is irradiated with the beam, due to the distortion or the like. Therefore, in the first embodiment, a position deviation amount of the actual irradiation position 39 of each beam is measured. Specifically, the position deviation amount of each beam is measured by measuring a position of a resist pattern generated by irradiating an evaluation substrate coated with a resist with the multiple beams 20 and developing the evaluation substrate, by a position measurement device. In a shot size of each beam, if it is difficult to measure a size of the resist pattern at the irradiation position of each beam by the position measurement device, a figure pattern (for example, a rectangular pattern) of a size that can be measured by the position measurement device may be written by each beam, edge positions on both sides of the figure pattern (resist pattern) may be measured, and a position deviation amount of a target beam may be measured from a difference between an intermediate position between both edges and an intermediate position of a design figure pattern. In addition, obtained position deviation amount data of the irradiation position of each beam is input to the writing apparatus 100 and is stored in the storage device 144. Further, in the multiple beam writing, writing is advanced while shifting the irradiation region 34 in the stripe region 32. For this reason, for example, in the writing sequence described in FIG. 8, as shown in the lower step of FIG. 6, during the writing of the stripe region 32, the position of the irradiation region 34 sequentially moves in the order of the irradiation regions 34a to 34o, and periodicity occurs in the position deviation of each beam every movement of the irradiation region 34. Alternatively, in the case of the writing sequence in which all the pixels 36 in the corresponding sub-irradiation region 29 are irradiated with each beam, as shown in FIG. 10B, periodicity occurs in the position deviation of each beam for each unit region 35 (35a, 35b, . . . ) having the same size as at least the irradiation region 34. Therefore, if the position deviation amount of each beam for one irradiation region 34 is measured, a measurement result can be used. In other words, for each beam, the position deviation amount at each pixel 36 in the corresponding sub-irradiation region 29 may be measured.

In addition, the beam position deviation map creation unit 54 first creates a beam position deviation amount map (1) defining a position deviation amount of each beam in the irradiation region 34, in a beam array unit. Specifically, the beam position deviation map creation unit 54 may read the position deviation amount data of the irradiation position of each beam from the storage device 144 and may create the beam position deviation amount map (1) using the data as a map value.

Next, the beam position deviation map creation unit 54 creates a beam position deviation amount map (2) in the control grid 27 of each pixel 36 in the stripe region 32. Which beam the control grid 27 of each pixel 36 in the stripe region 32 is irradiated with is determined by the writing sequence as described in FIG. 8, for example. Therefore, the beam position deviation map creation unit 54 identifies a beam for the irradiation of the control grid 27 for each control grid 27 of each pixel 36 in the stripe region 32, according to the writing sequence, and calculates a position deviation amount of the beam. In addition, the beam position deviation map creation unit 54 creates the beam position deviation amount map (2) in a stripe unit, using the position deviation amount of the irradiation position of the beam to each control grid 27 as the map value. As described above, since the periodicity occurs in the position deviation of each beam, the value of the beam position deviation amount map (1) in the beam array unit may be used to create the beam position deviation amount map (2) in the stripe unit. The created beam position deviation amount map (2) is stored in the storage device 144.

In the dose calculation step (S104), first, the rasterization unit 50 reads writing data from the storage device 140 and calculates a pattern area density p' in the pixel 36, for each pixel 36. The above processing is executed for each stripe region 32, for example.

Next, the dose map creation unit 52 first virtually divides the writing region (here, for example, the stripe region 32) into a plurality of proximity mesh regions (mesh regions for proximity effect correction calculation) in a mesh shape with a predetermined size. The size of the proximity mesh region is preferably set to about ⅒ of a range of influence of a proximity effect, for example, about 1 µm. The dose map creation unit 52 reads the writing data from the storage device 140 and calculates a pattern area density p of a pattern disposed in the proximity mesh region, for each proximity mesh region.

Next, the dose map creation unit 52 calculates a proximity effect correction dose coefficient Dp(x) (correction exposure intensity) for correcting the proximity effect, for each proximity mesh region. The unknown proximity effect correction dose coefficient Dp(x) can be defined by the same threshold model for proximity effect correction as the conventional method using a back scattering coefficient η, an exposure intensity threshold Dth of a threshold model, the pattern area density ρ, and a distribution function g(x).

Next, the dose map creation unit 52 calculates an incident exposure intensity D(x) (dose) for irradiating the pixel 36, for each pixel 36. The incident exposure intensity D(x) may be calculated as a value obtained by multiplying a preset base exposure intensity Dbase by the proximity effect correction dose coefficient Dp and the pattern area density ρ', for example. The base exposure intensity Dbase can be defined by Dth/(½+η), for example. As described above, it is possible to obtain an original desired incident exposure intensity D(x) in which the proximity effect has been corrected, based on the layout of the plurality of graphic patterns defined in the writing data.

In addition, the dose map creation unit 52 creates a dose map defining the incident exposure intensity D(x) for each pixel 36 in the stripe unit. The incident exposure intensity D(x) for each pixel 36 is a scheduled incident exposure intensity D(x) to be irradiated to the control grid 27 of the pixel 36, in designing. In other words, the dose map creation unit 52 creates a dose map defining the incident exposure intensity D(x) for each control grid 27 in the stripe unit. The created dose map is stored in the storage device 142, for example.

In the ON defect beam detection step (S110), the detection unit 56 detects an always-ON defect beam from the multiple beams 20. In the always-ON defect beam, irradiation of the beam of the maximum beam irradiation time Ttr in one shot is always performed regardless of the control dose. Alternatively, the irradiation is continuously performed during the movement between pixels. Specifically, under the control of the writing control unit 74, the writing mechanism 150 controls the multiple beams 20 to be beam ON by the individual blanking mechanism 47 one by one and controls all the remaining beams to be beam OFF. From this state, the control is switched such that a detection symmetric beam becomes beam OFF. At that time, the beam in which a current has been detected by the Faraday cup 106 despite the switching from beam ON to beam OFF is detected as a defect beam. If all the beams of the multiple beams 20 are sequentially checked by the same method, it is possible to detect the presence or absence of the defect beam and a position of the defect beam.

In the defect beam dose calculation step (S112), the ON defect beam dose calculation unit 58 calculates the dose of the defect beam. Here, the dose of the defect beam is calculated using the shot cycle and the current amount. Specifically, the following calculation is performed. The dose d' of the defect beam can be defined by the following formula (1) using a shot cycle Tsc (time), a beam area a, and a current density J. The beam area a can be calculated from the reduction ratio of the optical system by measuring the area of the hole 22 of the shaping aperture array substrate 203 in advance. The shot cycle Tsc includes a switching time of the pixel 36 for irradiating the beam, a settling time of the beam deflection, and a data transfer time, in addition to the maximum beam irradiation time Ttr per one shot of the multiple beams 20. The current amount can be calculated by the product of the beam area a and the current density J.

$$d' = a \cdot j \cdot Tsc \quad (1)$$

In the excess dose calculation step (S114), the excess dose calculation unit 60 calculates an excess dose by a defect beam in which the dose of the beam cannot be controlled and the dose to be irradiated becomes excessive. Specifically, the following calculation is performed. As described above, which pixel is irradiated with which beam is determined by the writing sequence. Therefore, the excess dose calculation unit 60 first identifies the pixel (control grid 27) to be irradiated with the detected defect beam, according to the writing sequence. Next, the excess dose calculation unit 60 refers to the dose map and calculates the dose (design dose) with which the pixel 36 is irradiated. In addition, the excess dose calculation unit 60 subtracts the dose D with which the pixel 36 (control grid 27) (small region on the target object) is irradiated from the dose of the defect beam and calculates the excess dose in the pixel 36 (control grid 27). The excess dose $\Delta$ can be defined by the following formula (2).

$$\Delta = d' - D \quad (2)$$

In the defect beam position calculation step (S116), the defect beam position calculation unit 62 calculates an irradiation position of the defect beam with respect to a writing target pattern.

Figure 11:
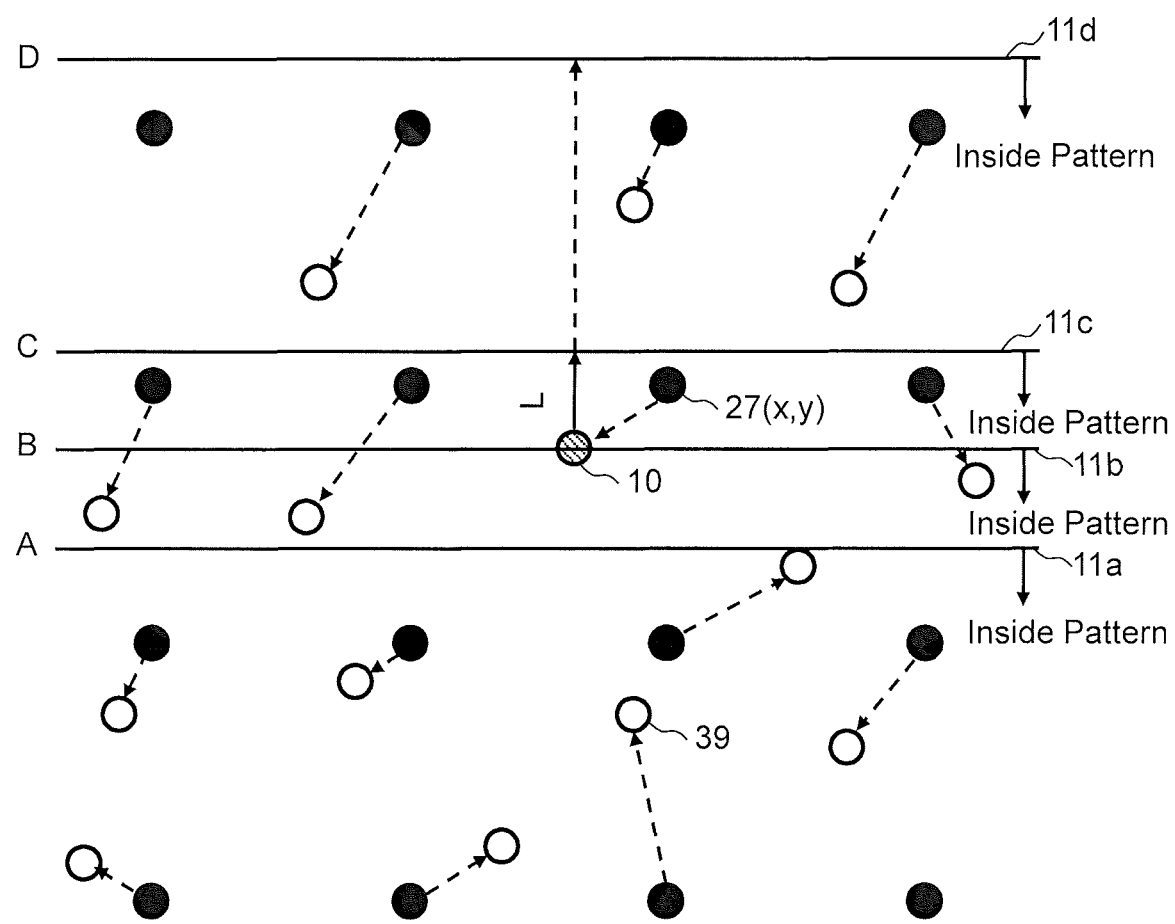
FIG. 11 is a diagram showing an example of a relation between a control grid, a beam irradiation position, and a pattern edge in the first embodiment.

FIG. 11 is a diagram showing an example of a relation between the control grid, the beam irradiation position, and the pattern edge in the first embodiment. The corresponding control grid 27 is ideally irradiated with each beam of the multiple beams 20. However, as shown in FIG. 11, the actual irradiation position 39 is often deviated from the control grid 27. When there is the defect beam 10 in the beam groups, a position relation with the writing target pattern causes a problem. As an assumed case, there is a case A in which the irradiation position of the defect beam 10 is located outside a pattern edge 11*a*, that is, outside the pattern. In addition, there is a case B in which the irradiation position of the defect beam 10 is located on a pattern edge 11*b*. In addition, there is a case C in which the irradiation position of the defect beam 10 is located inside the pattern and in the vicinity of a pattern edge 11*c*. In addition, there is a case D in which the irradiation position of the defect beam 10 is located inside the pattern and is sufficiently separated from a pattern edge 11*d*. Therefore, the defect beam position calculation unit 62 refers to the beam position deviation amount map (2) stored in the storage device 144 and the writing data stored in the storage device 140 and calculates the irradiation position of the defect beam 10 for the writing target pattern. Specifically, it is calculated whether the defect beam 10 is inside or outside the pattern and a distance L from the defect beam 10 (the center of gravity of the defect beam 10) to the pattern edge 11*c* is calculated.

In the position determination step (S118), as described later, in the case of sharing the same dose as the excess dose $\Delta$ and reducing the dose from the dose of the beam group around the defect beam 10, the determination unit 63 determines whether or not to consider a center-of-gravity position using each shared dose $\delta di$ to be shared, according to the distance L from the irradiation position of the defect beam 10 to the edge position of the writing target pattern. Specifically, the determination unit 63 determines whether the irradiation position of the defect beam 10 is outside the pattern (case A), on the pattern edge 11*b* (case B), inside the pattern and in the vicinity of the pattern edge 11*c* (case C), or inside the pattern and sufficiently separated from the pattern edge 11*d* (case D), with respect to the writing target pattern. By determining the above case, it is determined whether or not to consider the center-of-gravity position using each shared dose $\delta di$ to be shared.

In the first embodiment, the excess dose is shared by the peripheral beam group of the defect beam 10 (the shared dose is reduced) so as to offset the excess dose by the defect beam 10. Since irradiation of a minus dose cannot be performed, the dose of the peripheral beam group needs to be a positive finite value not to be zero, in order to perform sharing. Therefore, in the case A in which the irradiation position is located outside the pattern, the peripheral beams are also located outside the pattern, so that the dose is zero originally and cannot be shared. For this reason, in the first embodiment, the case A is excluded from excess dose correction targets. Therefore, in the first embodiment, a pattern shape variation due to the excess dose is corrected for the remaining cases B, C, and D.

Figure 12:
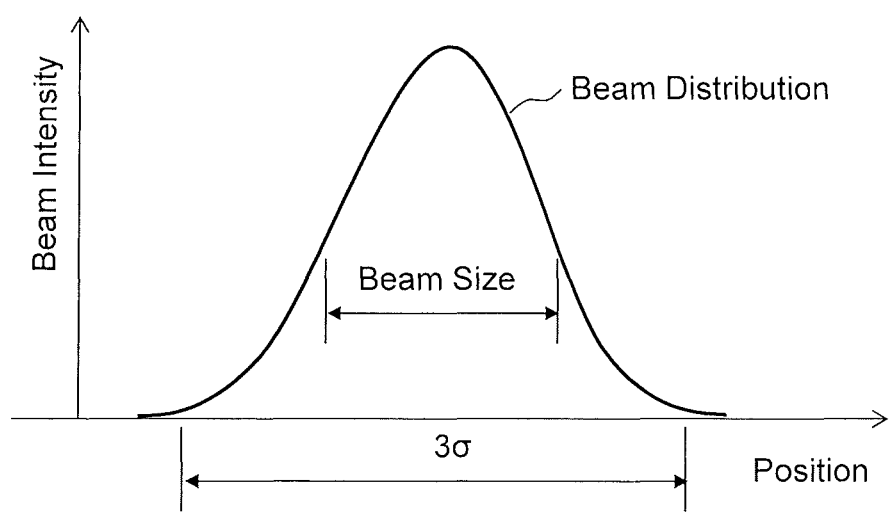
FIG. 12 is a diagram illustrating a beam distribution in the first embodiment.

FIG. 12 is a diagram illustrating a beam distribution in the first embodiment. In FIG. 12, a vertical axis indicates a beam intensity and a horizontal axis indicates a position. The intensity of each beam of the multiple beams ideally has a rectangular distribution of a width obtained by multiplying the width of the shaping aperture by the reduction ratio. However, in actuality, blurring occurs due to the aberration of the optical system and the intensity of each beam has a distribution close to a Gaussian distribution, for example. Even in this case, the width obtained by multiplying the width of the shaping aperture by the reduction ratio is set as the beam size. Therefore, the actual beam has a blurring portion with a weak intensity around the beam size. The excess dose due to the blurring portion also greatly affects the shape of the pattern edge. Therefore, in the first embodiment, the case in which it is likely to be affected by the blurring portion and the distance L from the irradiation position (the center of gravity of the defect beam 10) of the defect beam 10 to the pattern edge 11*c* is within $3\sigma$ of the beam distribution is defined as the vicinity of the pattern edge 11*c* of the case C described above. Further, in the case D in which the irradiation position (the center of gravity of the defect beam 10) of the defect beam 10 is located on the pattern center portion side where the distance L from the irradiation position of the defect beam 10 to the pattern edge 11*c* is larger than $3\sigma$ of the beam distribution, it is affected by the excess dose, but correction with accuracy lower than those in the cases B and C may be performed. Therefore, the subsequent processing is distinguished between the cases B and C and the case D. Specifically, whether or not to consider the center-of-gravity position using each shared dose $\delta di$ to be shared changes.

In the peripheral beam identification step (S120), in the case D in which the irradiation position (the center of gravity of the defect beam 10) of the defect beam 10 is located on the pattern center side where the distance L from the irradiation position of the defect beam 10 to the pattern edge 11*c* is larger than $3\sigma$ of the beam distribution, the identification unit 64 identifies a peripheral beam group located around the defect beam 10 inside the pattern.

Figure 13:
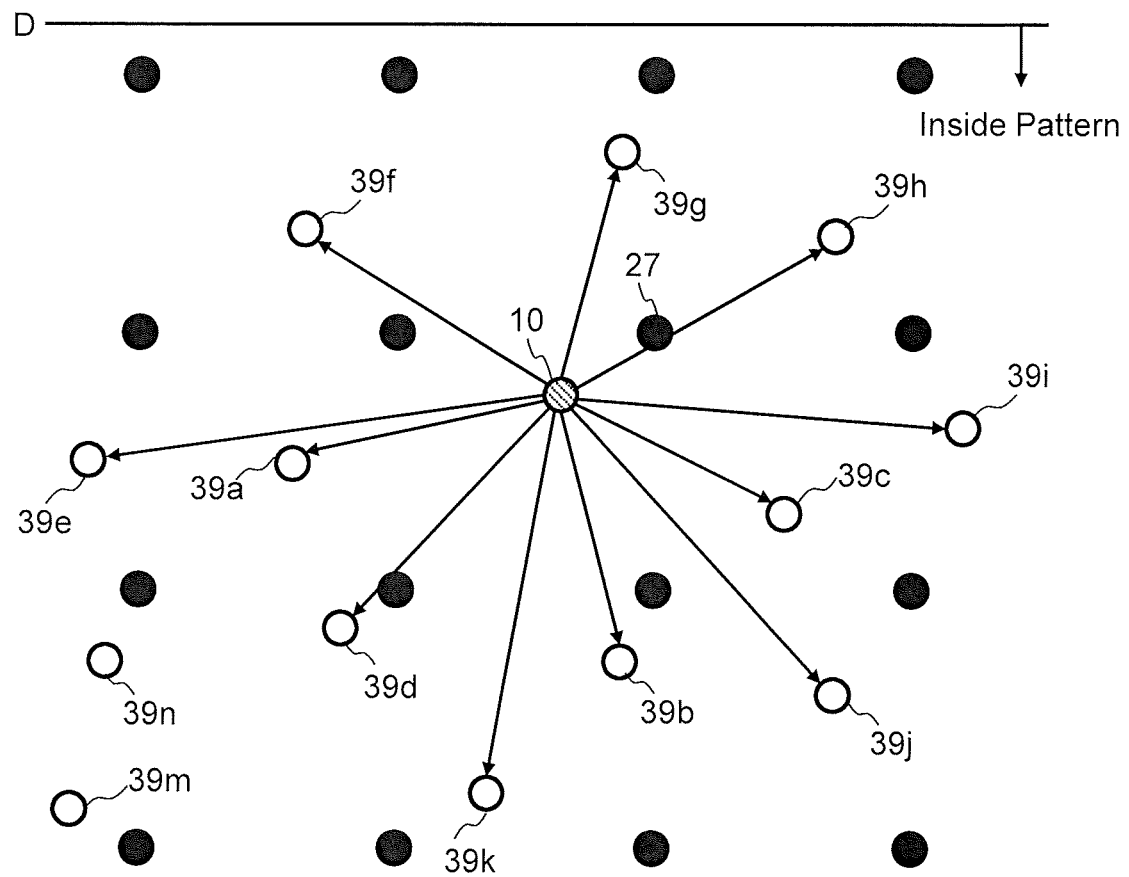
FIG. 13 is a diagram showing an example of peripheral beams of a defect beam in a pattern center portion in the first embodiment.

FIG. 13 is a diagram showing an example of peripheral beams of a defect beam in the pattern center portion in the first embodiment. The identification unit 64 identifies beams where the irradiation position 39 is located within a pitch between two beams from the irradiation position of the defect beam 10, as the peripheral beams. The inter-beam pitch may be a design size. In the example of FIG. 13, the case where eleven (N=11) beams to irradiation positions 39*a* to 39*k* within the pitch between the two beams in the entire peripheral region of the defect beam 10 are identified as the peripheral beams is shown. For example, irradiation positions 39*m* and 39*n* deviated from within the pitch between the two beams are removed from the peripheral beams. The extent to which the beams are set as the peripheral beams may be appropriately set. However, it is preferable to set beams whose irradiation positions are as close to the irradiation position of the defect beam 10 as possible. Further, the peripheral beams are selected from normal beams that are not the always-ON and always-OFF defect beams.

In the shared dose calculation step (S122), the shared dose calculation unit 67 calculates shared doses for sharing the same dose as the excess dose by the defect beam 10 by the peripheral beams of the defect beam 10. In the case D in which the irradiation position (the center of gravity of the defect beam 10) of the defect beam 10 is located on the pattern center portion side where the distance L from the irradiation position of the defect beam 10 to the pattern edge 11*c* is larger than 3σ of the beam distribution, since the excess dose has a small influence on the shape of the pattern edge, it is not necessary to increase the accuracy so much, and the center-of-gravity position of the total shared dose is not considered in order to shorten a calculation processing time. In the case D, each shared dose δd can be defined by the following formula (3) which divides the excess dose Δ by the number N of identified peripheral beams.

$$\delta d = \Delta/N \quad (3)$$

Even in the case D, in order to improve the correction accuracy, the shared dose may be varied according to a distance $r_i$ from the irradiation position of the defect beam 10 to the irradiation position of the peripheral beam. i indicates an index of a target peripheral beam among N peripheral beam groups. In this case, each shared dose $\delta d_i$ can be defined by the following formula (4) using the excess dose Δ and the distance $r_i$.

$$\delta d_i = \Delta \cdot \frac{1}{r_i} \Big/ \sum \frac{1}{r_i} \quad (4)$$

On the other hand, in the case B where the irradiation position of the defect beam 10 is located on the pattern edge 11*b* and in the case C where the irradiation position of the defect beam 10 is located inside the pattern and in the vicinity of the pattern edge 11*c*, since the pattern edge shape changes according to a method of sharing the excess dose, the center-of-gravity position of the total shared dose is considered in order to improve the correction accuracy.

In the peripheral beam identification step (S130), in the case B where the irradiation position of the defect beam 10 is located on the pattern edge 11*b* and in the case C where the irradiation position of the defect beam 10 is located inside the pattern and in the vicinity of the pattern edge 11*c*, the identification unit 65 identifies a peripheral beam group located around the defect beam 10 inside the pattern.

Figure 14:
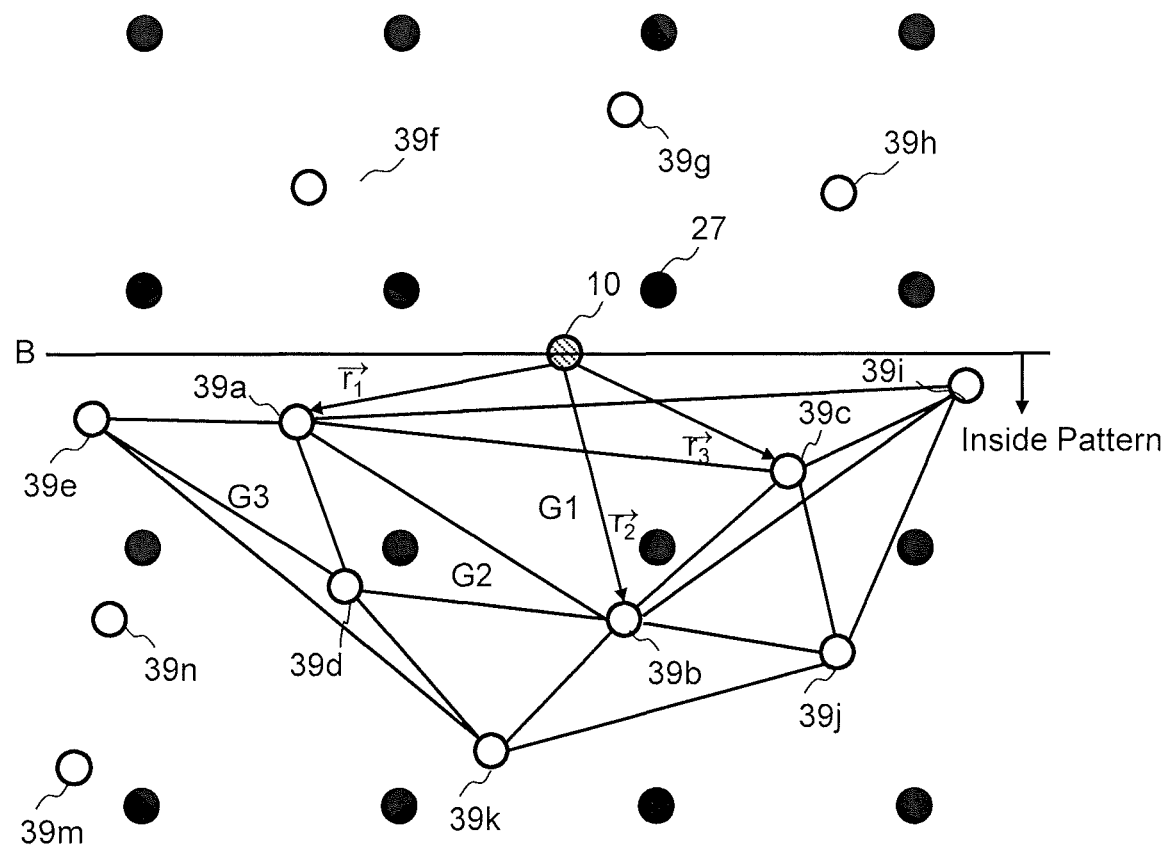
FIG. 14 is a diagram showing an example of peripheral beams of a defect beam on a pattern edge in the first embodiment.

FIG. 14 is a diagram showing an example of peripheral beams of a defect beam on a pattern edge in the first embodiment. The identification unit 65 identifies beams where the irradiation positions 39 are located within a pitch between two beams from the irradiation position of the defect beam 10 on the pattern edge, as the peripheral beams. The inter-beam pitch may be a design size. In the example of FIG. 14, the case where eight (N=8) beams to the irradiation positions 39*a* to 39*e* and 39*i* to 39*k* within the pitch between the two beams from the irradiation position of the defect beam 10 on the pattern edge in the region inside the pattern are identified as the peripheral beams is shown. The irradiation positions 39*f*, 39*g*, and 39*h* outside the pattern are removed from the peripheral beams. For example, irradiation positions 39*m* and 39*n* deviated from within the pitch between the two beams are removed from the peripheral beams. The extent to which the beams are set as the peripheral beams may be appropriately set. However, it is preferable to set beams whose irradiation positions are as close to the irradiation position of the defect beam 10 as possible.

Figure 15:
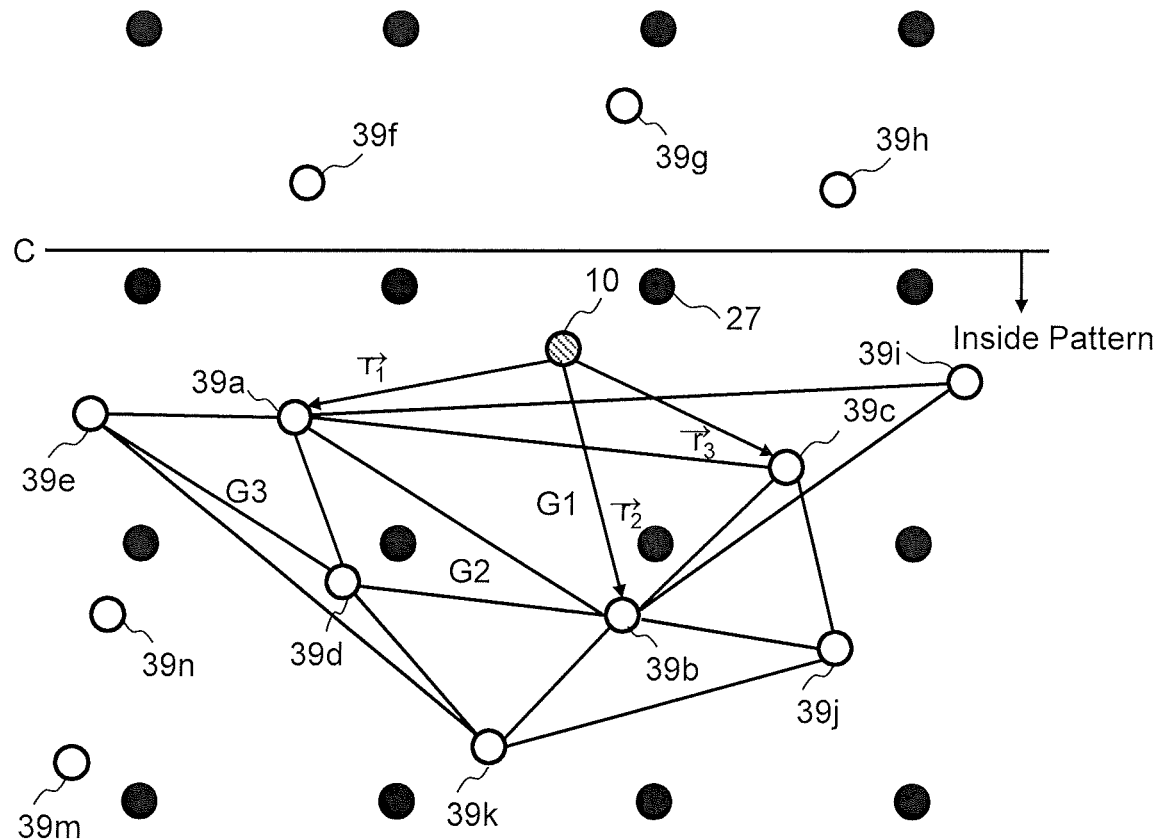
FIG. 15 is a diagram showing an example of peripheral beams of a defect beam in the vicinity of a pattern edge in a pattern in the first embodiment.

FIG. 15 is a diagram showing an example of peripheral beams of a defect beam in the vicinity of a pattern edge in a pattern in the first embodiment. The identification unit 65 identifies beams where the irradiation positions 39 are located within a pitch between two beams from the irradiation position of the defect beam 10 in the vicinity of the pattern edge (L≤3σ), as the peripheral beams. The inter-beam pitch may be a design size. In the example of FIG. 15, similar to the example of FIG. 14, the case where the eight (N=8) beams to the irradiation positions 39*a* to 39*e* and 39*i* to 39*k* within the pitch between the two beams from the irradiation position of the defect beam 10 in the vicinity of the pattern edge (L 3*o*) in the region inside the pattern are identified as the peripheral beams is shown. The irradiation positions 39*f*, 39*g*, and 39*h* outside the pattern are removed from the peripheral beams. For example, irradiation positions 39*m* and 39*n* deviated from within the pitch between the two beams are removed from the peripheral beams. The extent to which the beams are set as the peripheral beams may be appropriately set. However, it is preferable to set beams whose irradiation positions are as close to the irradiation position of the defect beam 10 as possible.

In the combination setting step (S132), the setting unit 66 sets a plurality of groups, by dividing a plurality of peripheral beams (first peripheral beams) of the defect beam 10 to the plurality of groups each configured by a plurality of peripheral beams (second beams), the number of the plurality of second beams being preset. In FIGS. 14 and 15, since the eight peripheral beams are identified as the plurality of peripheral beams (first beams) around defect beam 10, a plurality of groups each configured by three adjacent peripheral beams (second beams) in the eight peripheral beams are set. In the examples of FIGS. 14 and 15, for example, one group G1 is configured by three peripheral beams of the irradiation positions 39*a*, 39*b*, and 39*c*. For example, one group G2 is configured by three peripheral beams of the irradiation positions 39*a*, 39*b*, and 39*d*. For example, one group G3 is configured by three peripheral beams of the irradiation positions 39*a*, 39*d*, and 39*e*. In addition, one group is configured by three peripheral beams of the irradiation positions 39*d*, 39*e*, and 39*k*. One group is configured by three peripheral beams of the irradiation positions 39*b*, 39*d*, and 39*k*. One group is configured by three peripheral beams of the irradiation positions 39*b*, 39*j*, and 39*k*. One group is configured by three peripheral beams of the irradiation positions 39*b*, 39*c*, and 39*j*. One group is configured by three peripheral beams of the irradiation positions 39*b*, 39*c*, and 39*i*. One group is configured by three peripheral beams of the irradiation positions 39*c*, 39*i*, and 39*j*.

In the shared dose calculation step (S134), when the irradiation position of the defect beam 10 is in the vicinity of or on the edge of the pattern (the cases B and C), the shared dose calculation unit 69 calculates a plurality of shared doses in consideration of the center-of-gravity position. Specifically, the following calculation is performed. For each of the plurality of groups, the shared dose calculation unit 69 calculates each shared dose according to the distance ri from the irradiation position of the defect beam 10 to the irradiation position of a peripheral beam (second beam) of the plurality of peripheral beams (second beams) configuring the group. In the examples of FIGS. 14 and 15, for example, with respect to the three peripheral beams of the irradiation positions 39a, 39b, and 39c configuring the group G1, a shared dose δd1 for the beam of the irradiation position 39a, a shared dose δd2 for the beam of the irradiation position 39b, and a shared dose δd3 for the beam of the irradiation position 39c can be obtained by the above formula (4) using the excess dose Δ, a distance r1 from the irradiation position of the defect beam 10 to the irradiation position 39a of the peripheral beam, a distance r2 from the irradiation position of the defect beam 10 to the irradiation position 39b of the peripheral beam, and a distance r3 from the irradiation position of the defect beam 10 to the irradiation position 39c of the peripheral beam. The same is applied to the other groups.

In the center-of-gravity calculation step (S136), the center-of-gravity position calculation unit 68 calculates a center-of-gravity position of a plurality of shared doses shared by the plurality of peripheral beams (second beams) configuring the group, using the calculated each shared dose, for each group. In the examples of FIGS. 14 and 15, for example, the center-of-gravity positions of the shared doses δd1, δd2, and δd3 shared by the three peripheral beams of the irradiation positions 39a, 39b, and 39c configuring the group G1 are calculated. The center-of-gravity positions Gj' of the plurality of shared doses of each group can be defined by the following formula (5) using the vector distance ri from the irradiation position of the defect beam 10 to the irradiation positions of the plurality of peripheral beams (second beams) configuring the group Gj and the shared dose δdi. j indicates an index of a target group among the plurality of groups. Although the center-of-gravity position Gj' Gj' is represented by the vector in the formula (5), it may be separated into an x-direction position dx and a y-direction position dy from the irradiation position of the defect beam 10.

$$\vec{G'_j} = \Sigma \vec{r_i} \cdot \delta d_i \qquad (5)$$

In the combination selection step (S138), the selection unit 70 selects a group Gj in which a deviation between the center-of-gravity position Gj' and the irradiation position of the defect beam 10 is smaller, from the plurality of groups.

As described above, in the case where the plurality of groups each including the three peripheral beams (second beams) are set and the group to divide the excess dose Δ is selected, the deviation of the center-of-gravity position from the irradiation position of the defect beam 10 can be decreased, as compared with the case where all the peripheral beams (first beams) are caused to share the excess dose Δ according to the distance.

In the dose subtraction step (S140), the subtraction unit 71 subtract the corresponding shared dose δdi from the dose D of each of the peripheral beam groups (peripheral beams) of the defect beam 10, such that the same dose as the excess dose Δ by the defect beam 10 where the dose of the beam cannot be controlled and the dose to be irradiated is excessive among the multiple beams 20 is shared by the peripheral beam groups of the defect beam 10. The corresponding shared dose δdi is subtracted from the dose D of each of the N peripheral beams identified in the entire surrounding region in the case D and the three peripheral beams configuring the selected group in the cases B and C. The subtraction unit shares and reduces the same dose as the excess dose of the defect beam from the doses of the plurality of second beams of the selected group.

Since the multiple beams 20 are repeatedly used to write each stripe region 32, the plurality of pixels 36 (control grids 27) irradiated with the defect beam 10 exist. Therefore, the same processing is performed on each of the plurality of places.

By the above, the excess dose Δ by the always-ON defect beam 10 is offset. As described above, the proximity effect correction can be prevented from being disturbed by setting the total shared dose δdi to the same dose as the excess dose Δ. The dose map is updated using the dose of each pixel 36 (control grid 27) after sharing and reducing the same dose as the excess dose Δ. Alternatively, the dose map (2) is newly created.

As described above, according to the first embodiment, the dose modulation for correcting the shape error of the pattern caused by the excess dose in the multiple beam writing can be realized by a simple method. At this stage, it is possible to correct the shape error of the pattern caused by the excess dose Δ by the always-ON defect beam 10. However, the original shape error of the pattern caused by the deviation of the irradiation position of each beam remains uncorrected.

In the position deviation correction step (S150), the correction unit 72 calculates a dose modulation factor (first dose modulation factor) of the beam to the pixel 36 for correcting the position deviation of the irradiation pattern caused by the position deviation of the beam with which the pixel 36 is irradiated according to the writing sequence and a dose modulation factor (second dose modulation factor) for dose distribution to at least one pixel around the pixel, for each pixel 36.

Figures 16A, 16B:
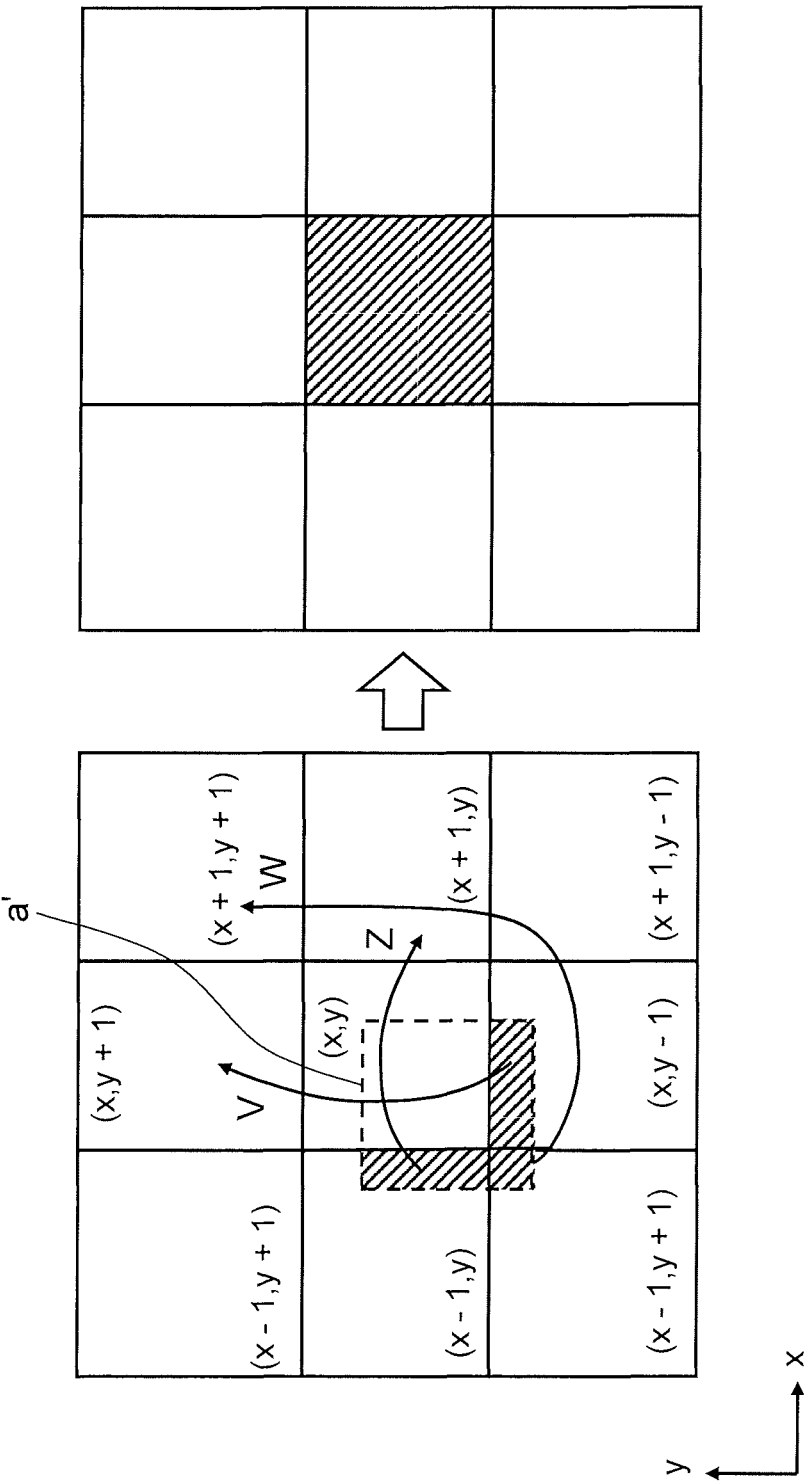
FIGS. 16A and 16B are diagrams illustrating an example of a position deviation correction method in the first embodiment.

FIGS. 16A and 16B are diagrams illustrating an example of a position deviation correction method in the first embodiment. In the example of FIG. 16A, the case where a beam a' with which the pixel of the coordinates (x, y) is irradiated causes the position deviation on the −x and −y sides is shown. In order to correct a position deviation of a pattern formed by the beam a' in which the position deviation occurs to a position matched with the pixel of the coordinates (x, y) as shown in FIG. 16B, the position deviation can be corrected by distributing the exposure intensity corresponding to the deviation amount to the pixels on the opposite side to the direction of the peripheral pixels to be deviated. In the example of FIG. 16A, the exposure intensity deviated to the pixel of the coordinates (x, y−1) may be distributed to the pixel of the coordinates (x, y+1). The exposure intensity deviated to the pixel of the coordinates (x−1, y) may be distributed to the pixel of the coordinates (x+1, y). The exposure intensity deviated to the pixel of the coordinates (x−1, y−1) may be distributed to the pixel of the coordinates (x+1, y+1).

In the first embodiment, a distribution amount (modulation factor of the second beam) for distributing the exposure intensity to the beams for at least one peripheral pixel in proportion to the position deviation amount of the beam is calculated. The correction unit 72 calculates a modulation factor of the beam to the pixel and a modulation factor of the beam to at least one peripheral pixel of the pixel, according to a ratio of a deviated area due to the position deviation of the beam to the pixel. Specifically, for each peripheral pixel in which the beam is deviated and a part of the beam overlaps, a ratio obtained by dividing the deviated area (area of the overlapping beam portion) by the beam area is calculated as the distribution amount (modulation factor of the beam) to the pixel located on the opposite side to the overlapping pixel.

In the example of FIG. 16A, the area ratio deviated to the pixel of the coordinates (x, y−1) can be calculated by (x-direction beam size−(−x)-direction deviation amount)×y-direction deviation amount/(x-direction beam size×y-direction beam size). Therefore, a distribution amount (modulation factor of the beam) V for distributing to the pixel of the coordinates (x, y+1) for correction can be calculated by (x-direction beam size−(−x)-direction deviation amount)×y-direction deviation amount/(x-direction beam size×y-direction beam size).

In the example of FIG. 16A, an area ratio deviated to the pixel of the coordinates (x−1, y−1) can be calculated by (−x)-direction deviation amount x−y-direction deviation amount/(x-direction beam size×y-direction beam size). Therefore, a distribution amount (modulation factor of the beam) W for distributing to the pixel of the coordinates (x+1, y+1) for correction can be calculated by (−x)-direction deviation amount x−y-direction deviation amount/(x-direction beam size×y-direction beam size).

In the example of FIG. 16A, an area ratio deviated to the pixel of the coordinates (x−1, y) can be calculated by −x-direction deviation amount×(y-direction beam size−(−y)-direction deviation amount)/(x-direction beam size×y-direction beam size). Therefore, a distribution amount (modulation factor of the beam) Z for distributing to the pixel of the coordinates (x+1, y) for correction can be calculated by −x-direction deviation amount×(y-direction beam size−(−y)-direction deviation amount)/(x-direction beam size×y-direction beam size).

As a result, a modulation factor U of the beam of the pixel of the coordinates (x, y), which corresponds to an amount left without being distributed, can be calculated by 1−V−W−Z.

In this way, for each pixel, the modulation factor of the beam to the pixel and the modulation factor of the beam to at least one peripheral pixel to be the distribution destination are calculated.

In addition, the correction unit 72 distributes the shared dose obtained by multiplying the dose D of the pixel 36 by the calculated dose modulation factor (second dose modulation factor) to the peripheral pixels to be the distribution destinations, for each pixel 36. As a result, it is possible to obtain a dose in which the position deviation/shape deviation of the pattern caused by the position deviation of the irradiation position of the beam has been corrected. The dose map is updated using the dose of each pixel 36 (control grid 27) after the position deviation of the irradiation position is corrected. Alternatively, a dose map (3) is newly created.

In the beam irradiation time calculation step (S152), the beam irradiation time calculation unit 73 refers to the latest dose map (or the dose map (3)) and calculates a beam irradiation time t corresponding to the dose D for each pixel 36 (control grid 27). The beam irradiation time t can be calculated by dividing the dose D by the current density. The beam irradiation time t of each pixel 36 (control grid 27) is calculated as a value within the maximum beam irradiation time Ttr in which irradiation can be performed with one shot of the multiple beams 20. The beam irradiation time data is stored in the storage device 142.

In the writing step (S156), first, the writing control unit 74 rearranges the beam irradiation time data in the order of shots according to the writing sequence. In addition, the beam irradiation time data is transferred to the deflection control circuit 130 in the order of shots. The deflection control circuit 130 outputs a blanking control signal to the blanking aperture array mechanism 204 in the order of shots and outputs deflection control signals to the DAC amplifier units 132 and 134 in the order of shots. In addition, the writing mechanism 150 writes the pattern on the target object 101, using the multiple beams 20 of the dose in which the same dose as the excess dose Δ of the defect beam 10 is shared and is reduced from the dose of the peripheral beam group (here, the dose in which the deviation of the beam irradiation position has been further corrected).

Figure 17A:
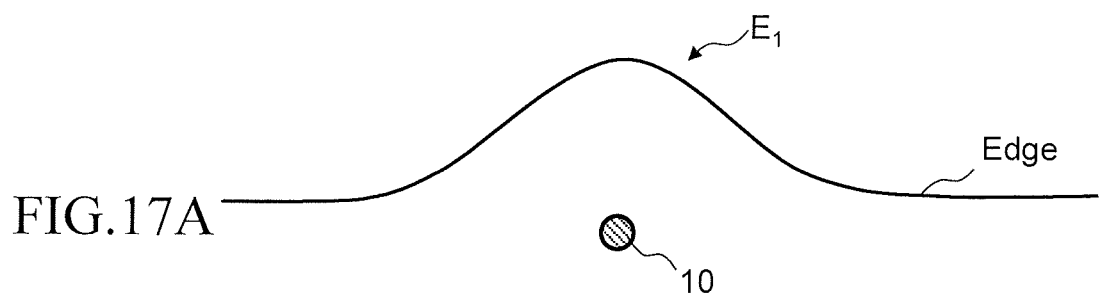
FIGS. 17A to 17C are diagrams illustrating effects of dose correction in the first embodiment.
Figure 17B:
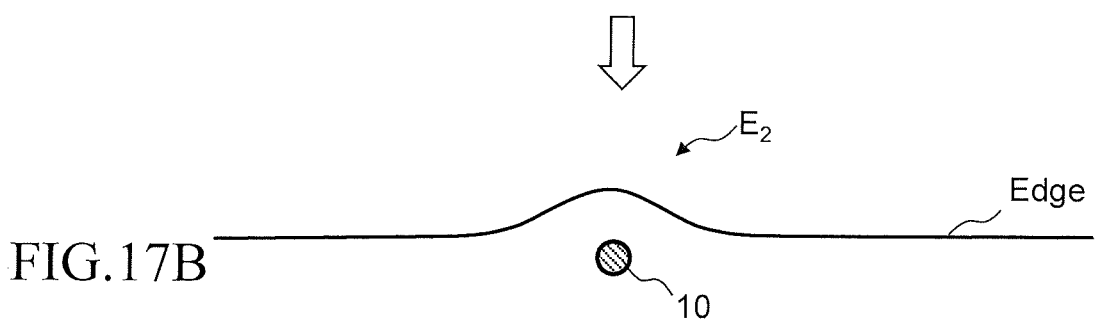
Figure 17C:
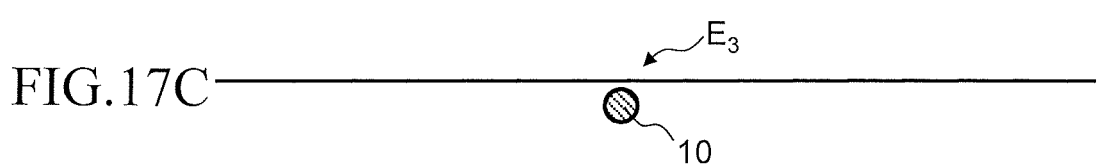

FIGS. 17A to 17C are diagrams illustrating effects of dose correction in the first embodiment. When the excess dose by the always-ON defect beam 10 is not corrected, as shown in FIG. 17A, the position of the pattern edge is greatly deformed to the outside of the pattern (E1). On the other hand, by performing excess dose correction in the first embodiment, a deformation amount of the pattern edge can be reduced as shown in FIG. 17B (E2). Further, by performing position deviation correction of the irradiation position of each beam, the deformation amount of the pattern edge can be further reduced as shown in FIG. 17C (E3).

As described above, according to the first embodiment, it is possible to reduce the shape error of the pattern caused by the excess dose by a simple method in the multiple beam writing. Further, the dose modulation for correcting the shape error of the pattern caused by the excess dose in the multiple beam writing can be realized by a simple method. Therefore, it is possible to shorten a calculation processing time of the dose modulation for correcting the shape error of the pattern caused by the excess dose. As a result, the calculation processing of the dose modulation and the writing operation can be executed in parallel.

Second Embodiment

In the first embodiment, the case where a beam irradiation time is controlled by an individual blanking mechanism 47 of a blanking aperture array mechanism 204 has been described. In this case, in an always-ON beam, irradiation is continuously performed not only during a maximum beam irradiation time Ttr in one shot but also during a movement between pixels (between shots). Therefore, in the second embodiment, a configuration in which beam cutting can be performed during the movement between the pixels (between the shots) will be described.

Figure 18:
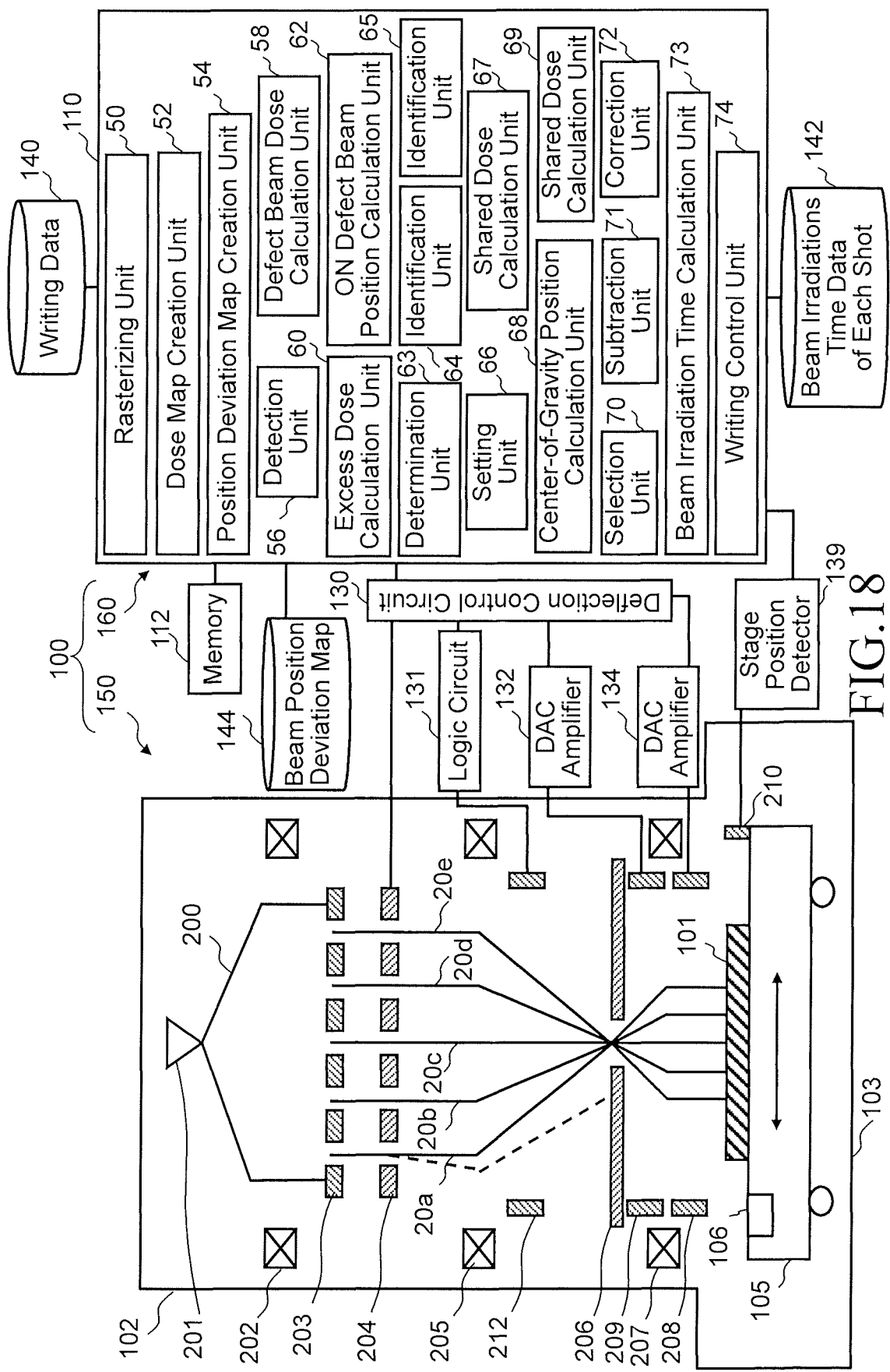
FIG. 18 is a conceptual diagram showing a configuration of a writing apparatus in a second embodiment.

FIG. 18 is a conceptual diagram showing a configuration of a writing apparatus in the second embodiment. FIG. 18 is the same as FIG. 1 except that a collective deflector 212 is additionally disposed between the blanking aperture array mechanism 204 and a limiting aperture substrate 206 and a logic circuit 131 for driving the collective deflector 212 is additionally disposed. Further, a flowchart showing main steps of a writing method in the second embodiment is the same as that of FIG. 9. Contents other than points specifically described below are the same as those in the first embodiment. The logic circuit 131 is connected to a deflection control circuit 130.

In FIG. 18, the collective deflector 212 (common blanker) can perform blanking deflection collectively for entire multiple beams 20. Thus the collective deflector 212 (example of controller) can turn off the multiple beams 20 collectively. Therefore, a beam ON time in each shot of the multiple beams 20 can be controlled by the collective deflector 212. For example, a maximum beam irradiation time Ttr of each shot of the multiple beams 20 can be divided into a plurality of beam sub-irradiation times including at least different times, and the plurality of beam sub-irradiation times can be collectively controlled by the collective deflector 212. In this case, the individual blanking mechanism 47 may control whether a beam is turned on or off during each beam sub-irradiation time. Necessary beam sub-irradiation times may be selected from the plurality of beam sub-irradiation times and combined such that a total becomes a desired beam irradiation time, for each pixel 36 (control grid). By a combination of sub-shots of the beam sub-irradiation times, a total can be a shot of the desired beam irradiation time. For example, when the maximum beam irradiation time Ttr per shot of the multiple beams 20 is defined by gradation values of 1024 gradations, the maximum beam irradiation time Ttr can be defined by Ttr=1024Δ' using a quantization unit Δ'. Therefore, 1024Δ can be divided into beam sub-irradiation times of 512Δ, 256Δ, 128Δ, 64Δ, 32Δ, 16Δ, 8Δ, 4Δ, 2Δ, and Δ, for example. Therefore, if the beam sub-irradiation times are selected from the beam sub-irradiation times of 512Δ, 256Δ, 128Δ, 64Δ, 32Δ, 16Δ, 8Δ, 4Δ, 2Δ, and Δ and zero such that the total becomes the desired beam irradiation time, by the combination of the sub-shots of the beam sub-irradiation times, the total can be the shot of the desired beam irradiation time.

In the above configuration, since a defect beam 10 is shielded by the collective deflector 212, irradiation of the beam is not performed during the movement between the sub-shots and between the pixels. Therefore, a dose d' of the defect beam 10 is different from that of the first embodiment.

In the defect beam dose calculation step (S112), the ON defect beam dose calculation unit 58 calculates the dose of the defect beam. The dose of the defect beam is calculated for a time when the entire multiple beams are not collectively deflected by the collective deflector 212 (deflector). Here, the dose of the defect beam is calculated using a beam ON time by the collective deflector 212 (common blanker) and a current amount. Specifically, the following calculation is performed. The dose d' of the defect beam can be defined by the following formula (6) using a beam ON time Tcom by the collective deflector 212 (common blanker), a beam area a, and a current density J. For the beam area a, an area of a hole 22 of the shaping aperture substrate 203 may be measured in advance. The current amount can be calculated by the product of the beam area a and the current density J.

$$d' = a \cdot j \cdot T\text{com}. \quad (6)$$

As described above, since the dose d' of the defect beam 10 can be decreased as compared with the first embodiment, an excess dose Δ can also be decreased. Therefore, a shared dose δdi to be shared by peripheral beams can also be decreased.

The other contents and effects are the same as those in the first embodiment.

The embodiments have been described with reference to the specific examples. However, the present disclosure is not limited to these specific examples.

Further, in the examples described above, the case where a control signal of 10 bits is input for control of each control circuit 41 has been described. However, the number of bits may be appropriately set. For example, a control signal of 2 bits or 3 to 9 bits may be used. A control signal of 11 bits or more may be used.

Further, in the examples described above, the excess dose Δ by the always-ON defect beam has been distributed to the groups of three beams. However, the excess dose Δ may be distributed to four or more beam groups.

When the dose of the peripheral beam of the defect beam is small and the total dose Δ0 of the beams of the predetermined number of groups is smaller than the excess dose Δ by the always-ON defect beam, processing of the shared dose calculation step (S122) may be changed to distribute the dose to a larger number of beam groups. Alternatively, processing of the shared dose calculation step (S122) and the dose subtraction step (S140) may be changed to fix the total dose distribution amount to Δ0.

Further, descriptions of parts and the like that are not directly necessary for explanation of the present disclosure, such as the apparatus configuration and the control method, are omitted. However, the necessary apparatus configuration and control method can be appropriately selected and used. For example, although the description of the control unit configuration for controlling the writing apparatus 100 is omitted, it goes without saying that the necessary control unit configuration is appropriately selected and used.

In addition, all multiple charged particle beam writing apparatuses and all multiple charged particle beam writing methods including the elements of the present disclosure and capable of being appropriately designed and changed by those skilled in the art are included in the scope of the present disclosure.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple charged particle beam writing apparatus comprising:
   a multiple charged particle beams generator configured to generate multiple charged particle beams;
   a subtraction processing circuit configured to subtract a corresponding shared dose from a dose of each of peripheral beams of a defect beam where control of a dose of a beam is disabled and the dose to be irradiated is excessive among the multiple charged particle beams, such that the same dose as an excess dose by the defect beam is subtracted from a total of doses of the peripheral beams of the defect beam and a deviation between a position of a center-of-gravity using each shared dose of the peripheral beams and an irradiation position of the defect beam is reduced; and
   a writing mechanism including a stage mounting a target object and a deflector deflecting the multiple charged particle beams and configured to write a pattern on the target object, using the multiple charged particle beams of doses in which the same dose as the excess dose of the defect beam is subtracted from the total of the doses of the peripheral beams.

2. The apparatus according to claim 1, further comprising:
   a setting processing circuit configured to set a plurality of groups, by dividing a plurality of first peripheral beams of the defect beam to the plurality of groups each configured by a plurality of second beams, the number of the plurality of second beams being preset;
   a shared dose calculation processing circuit configured to calculate each shared dose according to a distance from the defect beam to each second beam of the plurality of second beams configuring a group of the plurality of groups, for each of the plurality of groups;
   a center-of-gravity position calculation processing circuit configured to calculate a position of a center-of-gravity of a plurality of shared doses shared by the plurality of second beams configuring the group, using each shared dose calculated, for each group; and a selection processing circuit configured to select a group having a smaller deviation between the position of the center-of-gravity and an irradiation position of the defect beam from the plurality of groups, wherein the subtraction processing circuit shares the same dose as the excess dose of the defect beam and subtracts the same dose from the total of the doses of the plurality of second beams of the selected group.

3. The apparatus according to claim 1, further comprising: a determination processing circuit configured to determine whether or not to consider the position of the center-of-gravity using the each shared dose of the peripheral beams, according to a distance from an irradiation position of the defect beam to an edge position of a pattern of a writing target, in a case that the same dose as the excess dose is subtracted from the total of the doses of the peripheral beams of the defect beam.

4. The apparatus according to claim 3, further comprising: a shared dose calculation processing circuit configured to calculate a plurality of shared doses such that the deviation between the position of the center-of-gravity using each shared dose of the peripheral beams and the irradiation position of the defect beam is reduced, in a case that the irradiation position of the defect beam is in a vicinity of an edge of the pattern.

5. The apparatus according to claim 1, further comprising: a detection processing circuit configured to detect an always-ON defect beam which is always beam ON status from the multiple charged particle beams.

6. The apparatus according to claim 1, further comprising: a defect beam dose calculation processing circuit configured to calculate the dose of the defect beam.

7. The apparatus according to claim 6, further comprising: an excess dose calculation processing circuit configured to calculate the excess dose by the defect beam.

8. The apparatus according to claim 7, wherein the excess dose is calculated by subtracting a design dose for a small region on the target object irradiated with the defect beam, from the dose of the defect beam.

9. The apparatus according to claim 6, further comprising: a controller configured to turn off the multiple charged particle beams collectively; and wherein the dose of the defect beam is calculated for a time in a case that the multiple charged particle beams are not collectively turned off.

10. A multiple charged particle beam writing method comprising:

forming multiple charged particle beams;

subtracting a corresponding shared dose from a dose of each of peripheral beams of a defect beam where control of a dose of a beam is disabled and the dose to be irradiated is excessive among the multiple charged particle beams, such that the same dose as an excess dose by the defect beam is subtracted from a total of doses of the peripheral beams of the defect beam and a deviation between a position of a center-of-gravity using each shared dose of the peripheral beams and an irradiation position of the defect beam is reduced; and writing a pattern on a target object, using the multiple charged particle beams of doses in which the same dose as the excess dose of the defect beam is subtracted from the total of the doses of the peripheral beams.

* * * * *